US011869780B2

(12) United States Patent
Kawazu et al.

(10) Patent No.: US 11,869,780 B2
(45) Date of Patent: Jan. 9, 2024

(54) SUBSTRATE LIQUID PROCESSING APPARATUS

(71) Applicant: Tokyo Electron Limited, Tokyo (JP)

(72) Inventors: Takahiro Kawazu, Koshi (JP); Takafumi Tsuchiya, Koshi (JP); Hideaki Sato, Koshi (JP); Hidemasa Aratake, Koshi (JP); Osamu Kuroda, Koshi (JP); Takashi Nagai, Koshi (JP); Jiro Harada, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 349 days.

(21) Appl. No.: 16/126,106

(22) Filed: Sep. 10, 2018

(65) Prior Publication Data

US 2019/0080938 A1 Mar. 14, 2019

(30) Foreign Application Priority Data

Sep. 11, 2017 (JP) ................................. 2017-173864
Aug. 6, 2018 (JP) ................................. 2018-147545

(51) Int. Cl.
*H01L 21/06* (2006.01)
*H01L 21/677* (2006.01)
*H01L 21/67* (2006.01)

(52) U.S. Cl.
CPC .... *H01L 21/67086* (2013.01); *H01L 21/6719* (2013.01); *H01L 21/67253* (2013.01);
(Continued)

(58) Field of Classification Search
CPC .............. H01L 21/67; H01L 21/67005; H01L 21/67011; H01L 21/67023;
(Continued)

(56) References Cited

U.S. PATENT DOCUMENTS 5,845,660 A * 12/1998 Shindo .............. H01L 21/67028
134/186
6,158,447 A * 12/2000 Kamikawa ................ B08B 3/08
134/56 R
(Continued)

FOREIGN PATENT DOCUMENTS

JP 2012-216778 A 11/2012
JP 2013-093478 A 5/2013
JP 6118739 B 3/2017

*Primary Examiner* — Benjamin Kendall
*Assistant Examiner* — Kurt Sweely
(74) *Attorney, Agent, or Firm* — Pearne & Gordon LLP

(57) ABSTRACT

A substrate liquid processing apparatus includes a processing liquid storage unit configured to store a processing liquid therein; a processing liquid drain unit configured to drain the processing liquid from the processing liquid storage unit; and a control unit. The control unit performs a first control in a constant concentration mode in which a concentration of the processing liquid in the processing liquid storage unit is regulated to a predetermined set concentration and a second control in a concentration changing mode in which the concentration of the processing liquid is changed. In the second control, a set concentration after concentration change is compared with a set concentration before the concentration change, and when the set concentration after the concentration change is lower, the control unit controls the processing liquid drain unit to start draining of the processing liquid.

4 Claims, 11 Drawing Sheets

(52) U.S. Cl.
CPC .. *H01L 21/67057* (2013.01); *H01L 21/67173* (2013.01); *H01L 21/67754* (2013.01)

(58) Field of Classification Search
CPC ......... H01L 21/67063; H01L 21/67075; H01L 21/67017–67086; H01L 21/67155–6719; H01L 21/67253; H01L 21/67754
See application file for complete search history.

(56) References Cited

U.S. PATENT DOCUMENTS

| | | | | |
|---|---|---|---|---|
| 6,200,414 B1 * | 3/2001 | Hwang | ................ | B24B 37/015 156/345.18 |
| 6,780,277 B2 * | 8/2004 | Yokomizo | ......... | H01L 21/31111 156/345.11 |
| 7,169,231 B2 * | 1/2007 | Larson | ............. | H01L 21/67017 156/345.33 |
| 7,396,771 B2 * | 7/2008 | Miya | ................ | H01J 37/32449 438/719 |
| 8,409,997 B2 * | 4/2013 | Wei | ................... | H01L 21/31111 438/745 |
| 8,716,146 B2 * | 5/2014 | Nowling | ............. | H01L 29/6653 438/757 |
| 8,877,084 B2 * | 11/2014 | Zhang | ............... | H01L 21/67086 216/93 |
| 2002/0148485 A1 * | 10/2002 | Taft | ........................ | G05D 21/02 134/18 |
| 2004/0140365 A1 * | 7/2004 | Izuta | ................. | H01L 21/67248 237/12 |
| 2006/0157197 A1 * | 7/2006 | Maegawa | ......... | H01L 21/67086 156/345.18 |
| 2007/0034231 A1 * | 2/2007 | Takahashi | ......... | H01L 21/67253 134/3 |
| 2008/0023444 A1 * | 1/2008 | Osawa | ............. | H01L 21/67086 156/345.15 |
| 2013/0048215 A1 * | 2/2013 | Higashi | ............. | H01L 21/67086 156/345.15 |
| 2015/0221530 A1 * | 8/2015 | Hara | ................. | H01L 21/67028 134/18 |
| 2017/0098558 A1 * | 4/2017 | Hou | ................. | H01L 21/67086 |

* cited by examiner

| STEP NUMBER | PROCESSING MODE | SET TEMPERATURE | ... |
|---|---|---|---|
| 001 | NORMAL PROCESSING | 88.5 | ... |
| 002 | CONCENTRATION CHANGE | 86 | ... |
| 003 | CONCENTRATION CHANGE | 88.5 | ... |
| 004 | CONCENTRATION CHANGE | 86 | ... |
| ⋮ | ⋮ | ⋮ | ⋮ |

SUBSTRATE LIQUID PROCESSING APPARATUS

CROSS-REFERENCE TO RELATED APPLICATION

This application claims the benefit of Japanese Patent Application Nos. 2017-173864 and 2018-147545 filed on Sep. 11, 2017 and Aug. 6, 2018, respectively, the entire disclosures of which are incorporated herein by reference.

TECHNICAL FIELD

The embodiments described herein pertain generally to a substrate liquid processing apparatus and a recording medium.

BACKGROUND

Patent Document 1 describes a substrate liquid processing apparatus configured to drain a phosphoric acid solution, which is used as a processing liquid in an etching processing of a semiconductor, from a processing liquid storage unit and configured to supply a phosphoric acid solution and water into the processing liquid storage unit to maintain a constant phosphoric acid concentration in the phosphoric acid solution.

Patent Document 1: Japanese Patent No. 6,118,739

SUMMARY

As described above, the substrate liquid processing apparatus described in Patent Document 1 performs a processing while regulating a concentration of a processing liquid to be constant. In the substrate liquid processing apparatus, the concentration of the processing liquid may be needed to be changed during the processing to secure the flexibility of processing.

In view of the foregoing, an exemplary embodiment provides a technique of appropriately changing a concentration of a processing liquid.

In one exemplary embodiment, a substrate liquid processing apparatus includes a storage unit configured to store a processing liquid therein; a drain unit configured to drain the processing liquid from the storage unit; and a control unit configured to control the drain unit. The control unit performs a first control in a constant concentration period during which a concentration of the processing liquid in the storage unit is regulated to a predetermined set concentration and a second control in a concentration changing period during which the concentration of the processing liquid in the storage unit is changed. In the second control, a set concentration after concentration change is compared with a set concentration before the concentration change, and when the set concentration after the concentration change is lower than the set concentration before the concentration change, the control unit controls the drain unit to start draining of the processing liquid.

According to the exemplary embodiment, the concentration of the processing liquid can be changed appropriately.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 4 is a table showing an example of a recipe;

DETAILED DESCRIPTION

Figure 1:
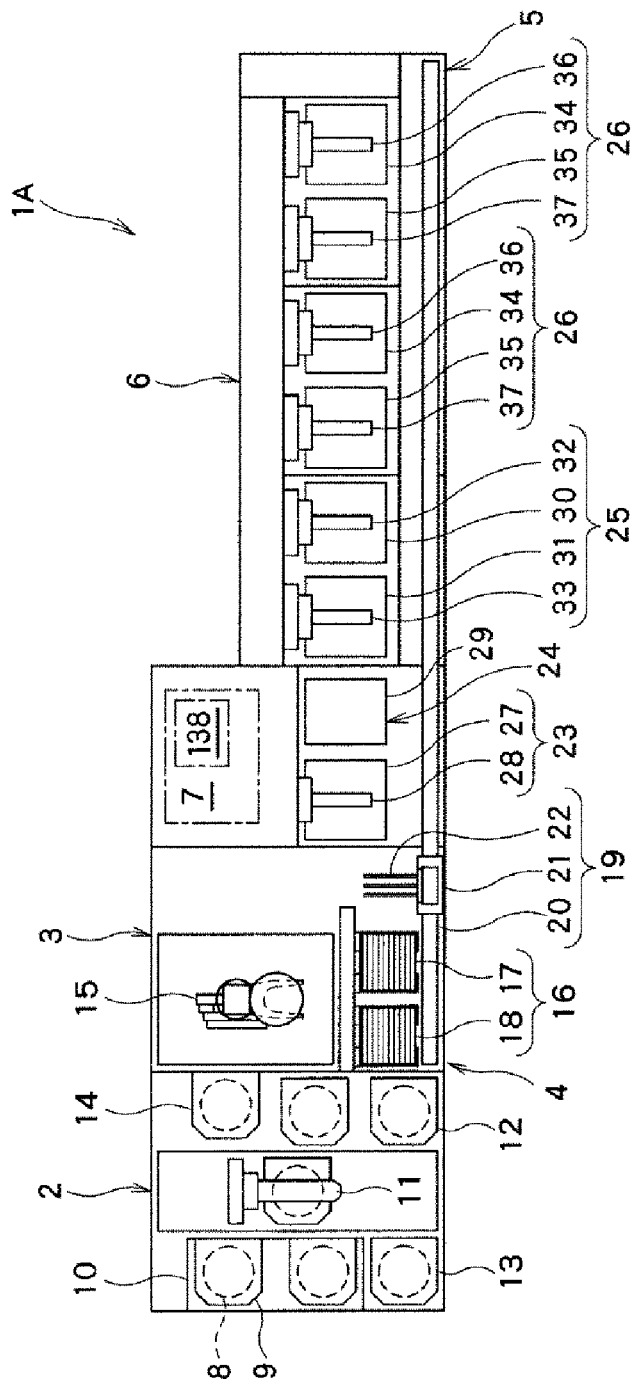
FIG. 1 is a plan view schematically illustrating a substrate liquid processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described with reference to the accompanying drawings. In the description, same parts or parts having same function will be assigned same reference numerals, and redundant description will be omitted. As illustrated in FIG. 1, the substrate liquid processing system 1A includes a carrier carry-in/out unit 2; a lot forming unit 3, a lot placing unit 4, a lot transferring unit 5, a lot processing unit 6 and a control unit 7.

The carrier carry-in/out unit 2 is configured to perform a carry-in and a carry-out of a carrier 9 in which a plurality (e.g., 25 sheets) of substrates (silicon wafers) 8 are vertically arranged in a horizontal posture. The carrier carry-in/out unit 2 is equipped with a carrier stage 10 configured to place multiple carriers 9 thereon; a carrier transfer device 11 configured to transfer the carrier 9; carrier stocks 12 and 13 configured to place therein the carrier 9 temporarily; and a carrier placing table 14 configured to place the carrier 9 thereon. Here, the carrier stock 12 temporarily places therein the substrate 8 to become a product before being processed by the lot processing unit 6. Further, the carrier stock 13 temporarily places therein the substrate 8 to become a product after being processed by the lot processing unit 6.

The carrier carry-in/out unit 2 transfers the carrier 9, which is carried onto the carrier stage 10 from the outside, to the carrier stock 12 or the carrier placing table 14 by using the carrier transfer device 11. Further, the carrier carry-in/out unit 2 transfers the carrier 9, which is placed on the carrier placing table 14, to the carrier stock 13 or the carrier stage 10 by using the carrier transfer device 11. The carrier 9 transferred to the carrier stage 10 is carried to the outside.

The lot forming unit 3 forms a lot composed of a multiple number (e.g., 50 sheets) of substrates 8 to be processed at the same time which are combined with substrates 8 accommodated in one or multiple carriers 9. Further, when forming the lot, the substrates 8 may be arranged such that surfaces thereof having patterns formed thereon face each other or such that the surfaces thereof having the patterns formed thereon all face to one direction. The lot forming unit 3 is equipped with a substrate transfer device 15 configured to transfer a plurality of substrates 8. Further, the substrate transfer device 15 is capable of changing a posture of the substrates 8 from a horizontal posture to a vertical posture and from the vertical posture to the horizontal posture while transferring the substrates 8.

In the lot forming unit 3, the substrates 8 are transferred into the lot placing unit 4 from the carrier 9 placed on the carrier placing table 14 by using the substrate transfer device 15, and the substrates 8 forming the lot are placed in the lot placing unit 4. Further, in the lot forming unit 3, the lot placed in the lot placing unit 4 is transferred into the carrier 9 placed on the carrier placing table 14 by the substrate transfer device 15. Further, the substrate transfer device 15 is equipped with, as a substrate supporting unit configured to support the multiple number of substrates 8, two types of substrate supporting unit, that is, a before-processed substrate supporting unit configured to support the substrates 8 before being subjected to a processing (that is, before being transferred by the lot transferring unit 5); and an after-processed substrate supporting unit configured to support the processed substrates 8 (after being transferred by the lot transferring unit 5). Accordingly, particles or the like adhering to the substrates 8 before being processed may be suppressed from adhering to the substrates 8 after being processed.

In the lot placing unit 4, the lot transferred between the lot forming unit 3 and the lot processing unit 6 by the lot transferring unit 5 is temporarily placed (stands by) on the lot placing table 16. The lot placing unit 4 is equipped with a carry-in side lot placing table 17 configured to place thereon the lot before being processed (before being transferred by the lot transferring unit 5); and a carry-out side lot placing table 18 configured to place thereon the lot after being processed (after being transferred by the lot transferring unit 5). On each of the carry-in side lot placing table 17 and the carry-out side lot placing table 18, the multiple number of substrates 8 corresponding to the single lot are arranged in a forward-backward direction with the vertical posture.

In the lot placing unit 4, the lot formed in the lot forming unit 3 is placed on the carry-in side lot placing table 17, and this lot is carried into the lot processing unit 6 through the lot transferring unit 5. Further, in the lot placing unit 4, the lot carried out of the lot processing unit 6 through the lot transferring unit 5 is placed on the carry-out side lot placing table 18, and this lot is transferred into the lot forming unit 3.

The lot transferring unit 5 is configured to transfer the lot between the lot placing unit 4 and the lot processing unit 6 and within the lot processing unit 6. The lot transferring unit 5 is equipped with the lot transfer device 19 configured to transfer the lot. The lot transfer device 19 includes a rail 20 extended along the lot placing unit 4 and the lot processing unit 6; and a moving body 21 configured to be moved along the rail 20 while holding the multiple number of substrates 8. The moving body 21 is provided with a substrate holding body 22 for holding the multiple number of substrates 8 arranged in the forward-backward direction with the vertical posture, and the substrate holding body 22 is configured to be movable forward and backward.

The lot transferring unit 5 receives the lot placed on the carry-in side lot placing table 17 with the substrate holding body 22 of the lot transfer device 19 and delivers the received lot to the lot processing unit 6. Further, the lot transferring unit 5 receives the lot processed by the lot processing unit 6 with the substrate holding body 22 of the lot transfer device 19 and delivers the received lot to the carry-out side lot placing table 18. Further, the lot transferring unit 5 also performs the transfer of the lot within the lot processing unit 6 by using the lot transfer device 19.

The lot processing unit 6 is configured to perform a processing such as etching, cleaning, or drying on the single lot composed of the substrates 8 arranged in the forward-backward direction with the vertical posture. The lot processing unit 6 includes a drying apparatus 23 configured to perform a drying processing on the substrates 8; a substrate holding body cleaning apparatus 24 configured to perform a cleaning processing on the substrate holding body 22; a cleaning apparatus 25 configured to perform a cleaning processing on the substrates 8; and two etching apparatuses 26 according to the exemplary embodiment, each of which is configured to perform an etching processing on the substrates 8.

The drying apparatus 23 is equipped with a processing tub 27; and a substrate elevating device 28 provided at the processing tub 27 and configured to be moved up and down. A processing gas for drying (IPA (isopropyl alcohol) or the like) is supplied into the processing tub 27. The substrate elevating device 28 holds the substrates 8 corresponding to the single lot while keeping the substrates 8 arranged in the forward-backward direction with the vertical posture. The drying apparatus 23 receives the lot from the substrate holding body 22 of the lot transfer device 19 with the substrate elevating device 28, and moves the received lot up and down with the substrate elevating device 28, so that the drying processing of the substrates 8 is performed with the processing gas for drying supplied into the processing tub 27. Further, the drying apparatus 23 delivers the lot to the substrate holding body 22 of the lot transfer device 19 from the substrate elevating device 28.

The substrate holding body cleaning apparatus 24 includes a processing tub 29 and is configured to supply a processing liquid for cleaning and a drying gas into this processing tub 29. By supplying the drying gas after supplying the processing liquid for cleaning to the substrate holding body 22 of the lot transfer device 19, the cleaning processing on the substrate holding body 22 is performed.

The cleaning apparatus 25 has a processing tub 30 for cleaning and a processing tub 31 for rinsing. The processing tub 30 for cleaning is equipped with a substrate elevating device 32 configured to be vertically movable, and the processing tub 31 for rinsing is equipped with a substrate elevating device 33 configured to be vertically movable. The processing tub 30 for cleaning stores therein a processing liquid for cleaning (SC-1 or the like). The processing tub 31 for rinsing stores therein a processing liquid for rinsing (pure water or the like).

The etching apparatus 26 has a processing tub 34 for etching and a processing tub 35 for rinsing. The processing tub 34 and the processing tub 35 are equipped with a substrate elevating device 36 and a substrate elevating device 37 configured to be vertically movable, respectively. The processing tub 34 for etching stores therein a processing liquid for etching (a phosphoric acid aqueous solution). The processing tub 35 for rinsing stores therein a processing liquid for rinsing (pure water or the like).

The cleaning apparatus 25 and the etching apparatus 26 have the same configuration. The etching apparatus 26 will be described. The multiple number of substrates 8 constituting the single lot are held by the substrate elevating device 36 while being arranged in the forward-backward direction with the vertical posture. In the etching apparatus 26, the substrate elevating device 36 receives the lot from the substrate holding body 22 of the lot transfer device 19, and the received lot is moved up and down by the substrate elevating device 36. Accordingly, the lot is immersed in the processing liquid for etching in the processing tub 34, so that the etching processing is performed on the substrates 8. Thereafter, the etching apparatus 26 delivers the lot to the substrate holding body 22 of the lot transfer device 19 from the substrate elevating device 36. Then, the lot is received by the substrate elevating device 37 from the substrate holding body 22 of the lot transfer device 19, and the received lot is moved up and down by the substrate elevating device 37. Accordingly, the lot is immersed in the processing liquid for rinsing in the processing tub 35, so that a rinsing processing is performed on the substrates 8. Thereafter, the lot is delivered to the substrate holding body 22 of the lot transfer device 19 from the substrate elevating device 37.

The control unit 7 controls operations of individual components (the carrier carry-in/out unit 2, the lot forming unit 3, the lot placing unit 4, the lot transferring unit 5, the lot processing unit 6) of the substrate liquid processing system 1A. The control unit 7 may be implemented by, for example, a computer and has a computer-readable recording medium 138. The recording medium 138 stores therein programs for controlling various types of processings performed in the substrate liquid processing system 1A. The control unit 7 controls the operation of the substrate liquid processing system 1A by reading and executing the programs stored in the recording medium 138. Further, the programs are stored in the compute-readable recording medium 138 and may be installed to the recording medium 138 of the control unit 7 from another recording medium. The computer-readable recording medium 138 may be implemented by, by way of example, a hard disk HD, a flexible disk FD, a compact disk CD, a magnet optical disk MO, a memory card, or the like.

[Substrate Liquid Processing Apparatus]

Figure 2:
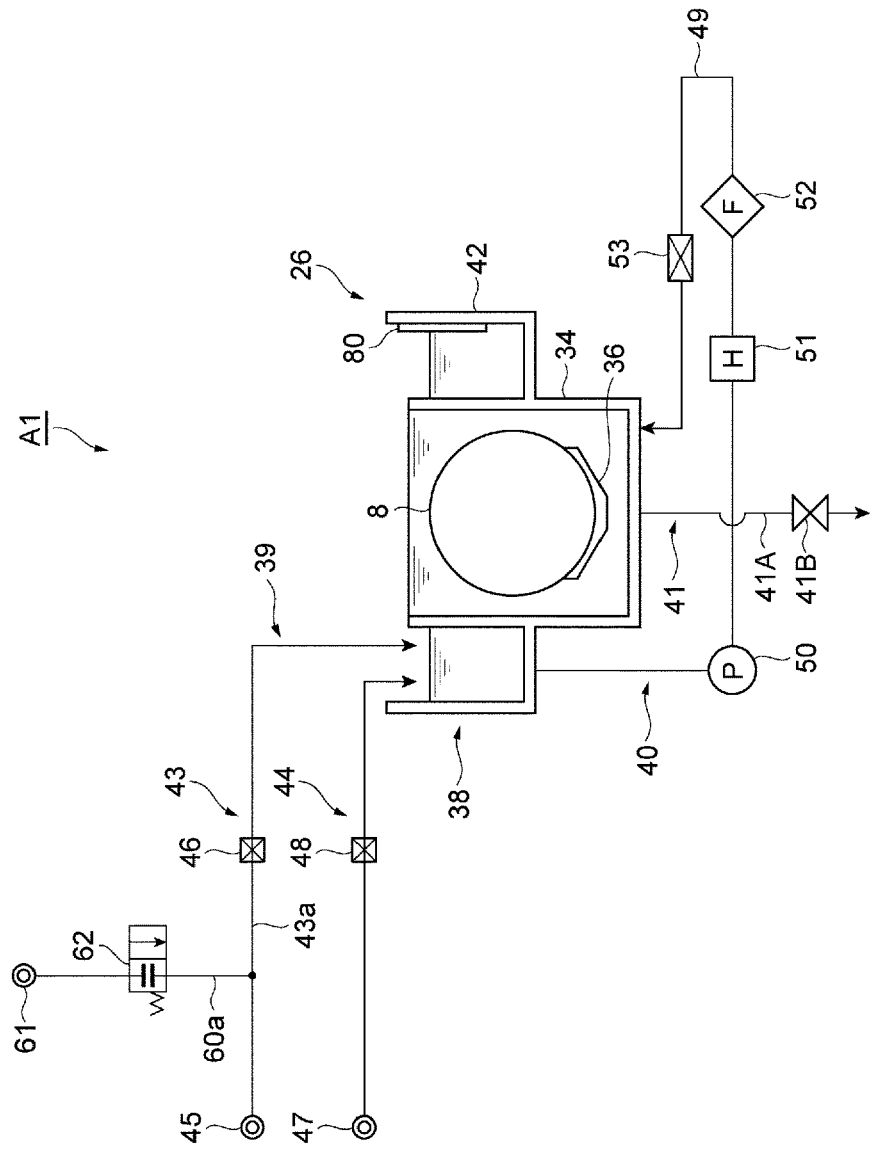
FIG. 2 is a schematic diagram of a substrate liquid processing apparatus.

Now, a substrate liquid processing apparatus A1 belonging to the substrate liquid processing system 1A will be described in detail with reference to FIG. 2. As illustrated in FIG. 2, the substrate liquid processing apparatus A1 includes an etching apparatus 26.

The etching apparatus 26 is configured to perform a liquid processing (etching processing) on the substrate 8 by using an aqueous solution of a chemical (phosphoric acid) having a preset concentration (for example, 88.3 wt % of phosphoric acid aqueous solution) as a processing liquid for the etching. The above-described "88.3 wt %" is an example of the concentration of the phosphoric acid aqueous solution in a case where a concentration of the processing liquid is regulated to a predetermined set concentration ("constant concentration mode". Details of this will be described later). Further, in a case where the concentration of the processing liquid is changed ("concentration changing mode". Details of this will be described later), the concentration of the phosphoric acid aqueous solution is not constant but changed appropriately. The etching apparatus 26 is equipped with, as shown in FIG. 2, a processing liquid storage unit 38 (storage unit), a processing liquid supply unit 39 (concentration increase promoting unit), a processing liquid circulation unit 40, and a processing liquid drain unit 41 (drain unit).

The processing liquid storage unit 38 stores the processing liquid, and the substrate 8 is processed therein. The processing liquid storage unit 38 includes a processing tub 34 having an open top; and an outer tub 42 which has an open top and is provided around an upper portion of the processing tub 34. The processing liquid is stored in the processing tub 34 and the outer tub 42. The processing tub 34 stores therein the processing liquid in which the substrate 8 is being immersed by the substrate elevating device 36 to be processed. The outer tub 42 stores therein the processing liquid overflowing from the processing tub 34. The processing liquid stored in the outer tub 42 is supplied into the processing tub 34 by the processing liquid circulation unit 40. The outer tub 42 is equipped with a liquid surface sensor 80. The liquid surface sensor 80 is configured to detect a liquid surface height in the outer tub 42 of the processing liquid storage unit 38. As the liquid surface sensor 80, various sensors capable of detecting the liquid surface height can be used. In the following description, the liquid surface sensor 80 will be described as a sensor configured to detect a liquid surface height from a voltage value. The liquid surface sensor 80 outputs information about the detected liquid surface height to the control unit 7.

The processing liquid supply unit 39 is configured to supply the processing liquid into the processing liquid storage unit 38. The processing liquid supply unit 39 includes an aqueous solution supply unit 43 and a water supply unit 44. The aqueous solution supply unit 43 includes an aqueous solution supply source 45, a flow rate controller 46, a water supply source 61, and a valve 62.

When regulating the concentration of the processing liquid to a predetermined set concentration ("constant concentration mode"), the aqueous solution supply source 45 supplies a phosphoric acid aqueous solution having a higher concentration than that of the phosphoric acid aqueous solution stored in the processing liquid storage unit 38. The aqueous solution supply source 45 supplies, for example, a phosphoric acid aqueous solution having a concentration of 88.3 wt % and a temperature of 25° C. The phosphoric acid aqueous solution supplied from the aqueous solution supply source 45 is supplied into the processing liquid storage unit 38 through a flow path 43a.

The flow rate controller 46 is provided at a downstream side of the aqueous solution supply source 45 on the flow path 43a. The flow rate controller 46 is connected to the control unit 7, and an opening/closing operation and a flow rate of the flow rate controller 46 are controlled by the control unit 7. The water supply source 61 supplies water (pure water) having a preset temperature (25° C.) into the flow path 43a. The water supplied from the water supply source 61 is supplied into the flow path 43a (specifically, between the aqueous solution supply source 45 and the flow rate controller 46 on the flow path 43*a*) through a flow path 60*a*.

The valve 62 is provided at a downstream side of the water supply source 61 in the flow path 60*a*. The valve 62 is connected to the control unit 7, and an opening/closing operation of the valve 62 is controlled by the control unit 7. When the valve 62 is turned into an open state (normal state) by the control unit 7, the water supplied from the water supply source 61 through the flow path 60*a* is flown into the flow path 43*a*. Thus, the concentration of the phosphoric acid aqueous solution supplied from the aqueous solution supply source 45 is decreased. Therefore, when regulating the concentration of the processing liquid to a predetermined set concentration ("constant concentration mode"), a phosphoric acid aqueous solution (e.g., 85 wt % of phosphoric acid aqueous solution) having a lower concentration than that of the phosphoric acid aqueous solution stored in the processing liquid storage unit 38 is supplied into the processing liquid storage unit 38.

When the valve 62 is turned into a closed state (concentration increased state) by the control unit 7, the water supplied from the water supply source 61 is not flown into the flow path 43*a*. Thus, a high-concentration phosphoric acid aqueous solution supplied from the aqueous solution supply source 45 is supplied to the processing liquid storage unit 38 as it is. In this way, the aqueous solution supply unit 43 of the processing liquid supply unit 39 supplies a phosphoric acid aqueous solution having a higher concentration than that of the phosphoric acid aqueous solution stored in the processing liquid storage unit 38 into the processing liquid storage unit 38 to promote an increase in the concentration of the processing liquid in the processing liquid storage unit 38 (details of this will be described later).

The water supply unit 44 is configured to supply water (pure water) into the processing liquid storage unit 38. The water supply unit 44 includes a water supply source 47 for supplying the pure water of a preset temperature (25° C.), and the water supply source 47 is connected to the outer tub 42 of the processing liquid storage unit 38 via a flow rate controller 48. The flow rate controller 48 is connected to the control unit 7, and an opening/closing operation and a flow rate of the flow rate controller 48 are controlled by the control unit 7.

The processing liquid circulation unit 40 is configured to send the processing liquid in the outer tub 42 into the processing tub 34. The processing liquid circulation unit 40 includes a circulation path 49, a pump 50, a heater 51, a filter 52, and a concentration meter 53. The circulation path 49 is a flow path extended from a bottom portion of the outer tub 42 of the processing liquid storage unit 38 to a bottom portion of the processing tub 34. The circulation path 49 is equipped with the pump 50, the heater 51, the filter 52, and the concentration meter 53 which are provided in sequence from an upstream side (outer tub 42 side) toward a downstream side (processing tub 34 side). The pump 50 and the heater 51 are connected to and driven by the control unit 7. The pump 50 is configured to force-feed the processing liquid from the upstream side toward the downstream side. The heater 51 is configured to heat the processing liquid to a set temperature (e.g., 165° C.). The filter 52 is configured to remove particles mixed in the processing liquid. The concentration meter 53 is configured to measure a phosphoric acid concentration in the processing liquid in the circulation path 49. The concentration meter 53 outputs the measured phosphoric acid concentration to the control unit 7.

The processing liquid drain unit 41 is configured to drain the processing liquid from the processing tub 34. The processing liquid drain unit 41 has, for example, a liquid drain path 41A and a valve 41B. The processing liquid within the processing tub 34 is drained through the liquid drain path 41A. One end of the liquid drain path 41A is connected to the bottom portion of the processing tub 34, and the other end of the liquid drain path 41A is connected to a liquid drain pipe (not shown) of the substrate liquid processing system 1A. The valve 41B is provided at the liquid drain path 41A. The valve 41B is connected to the control unit 7, and an opening/closing operation of the valve 41B is controlled by the control unit 7.

Hereinafter, the control unit 7 configured to control the etching apparatus 26 will be described in detail with reference to FIG. 3. The control unit 7 performs a first control in the constant concentration mode (constant concentration period) in which the concentration of the processing liquid in the processing liquid storage unit 38 is regulated to a predetermined set concentration; and a second control in the concentration changing mode (concentration changing period) in which the concentration of the processing liquid in the processing liquid storage unit 38 is changed. Further, all the constant concentration mode and the concentration changing mode to be described below refer to modes within a substrate processing period during which the substrate 8, which is a processing target, is immersed in the processing liquid in the processing liquid storage unit 38 to be processed with the processing liquid. That is, the control unit 7 is configured to perform the first control and the second control in the substrate processing period. Further, in an interval period during which the substrate 8 is not immersed in the processing liquid in the processing liquid storage unit 38, the control unit 7 regulates the concentration of the processing liquid in the processing liquid storage unit 38 to the predetermined set concentration in the constant concentration mode.

In the second control, the control unit 7 compares a set concentration after the concentration change with a set concentration before the concentration change, and if the set concentration after the concentration change is lower than the set concentration before the concentration change, the control unit 7 controls the processing liquid drain unit 41 (specifically, the valve 41B) to start draining of the processing liquid.

To be more specific, in the second control, if the set concentration after the concentration change is lower than the set concentration before the concentration change and the liquid surface height detected by the liquid surface sensor 80 is higher than a predetermined liquid surface reference value, the control unit 7 controls the processing liquid drain unit 41 (specifically, the valve 41B) to start the draining of the processing liquid.

Further, in the second control, the control unit 7 compares the set concentration after the concentration change with the set concentration before the concentration change, and if the set concentration after the concentration change is higher than the set concentration before the concentration change, the control unit 7 controls the aqueous solution supply unit 43 of the processing liquid supply unit 39 to promote the increase in the concentration of the processing liquid in the processing liquid storage unit 38.

Figure 3:
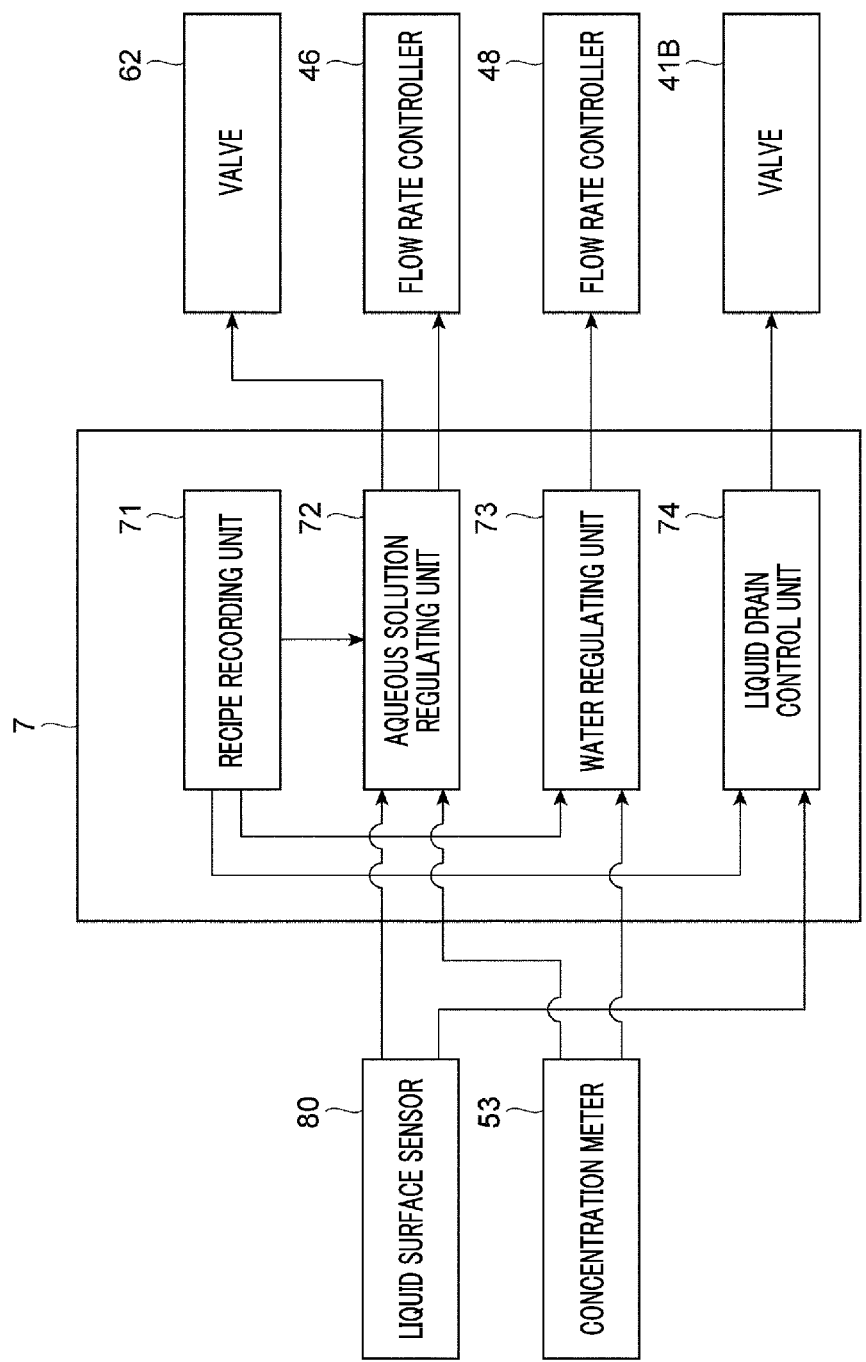
FIG. 3 is a block diagram illustrating a functional configuration of a control unit.

FIG. 3 is a block diagram illustrating a functional configuration of the control unit 7. As depicted in FIG. 3, the control unit 7 includes, as functional components (functional modules), a recipe recording unit 71, an aqueous solution regulating unit 72, a water regulating unit 73, and a liquid drain control unit 74.

The recipe recording unit 71 functions to record a preset recipe (operation instructions). For example, the recipe recording unit 71 stores a recipe previously set by a user. The control unit 7 is configured to perform a preset processing (control) according to the recipe. FIG. 4 is a table showing an example of a recipe RP. As shown in FIG. 4, at least a step number, a processing mode and a set concentration are set in the recipe RP. The step number refers to information uniquely specifying a step (process) in consecutively performed processings. Consecutive step numbers (e.g., "001" and "002", and the like) represent consecutive steps. Further, a step (level) with a smaller step number is performed earlier. In the example illustrated in FIG. 4, a processing is performed in sequence from a step with a step number "001" to a step with a step number "002", a step with a step number "003" and a step with a step number "004".

The processing mode refers to information on a mode of a processing for regulating the concentration of the processing liquid in the processing liquid storage unit 38. In the substrate processing period, the processing mode can be set to "constant concentration mode" and "concentration changing mode". The constant concentration mode refers to a mode in which the concentration of the processing liquid in the processing liquid storage unit 38 is regulated to a predetermined set concentration. The concentration changing mode refers to a mode in which the concentration of the processing liquid in the processing liquid storage unit 38 is changed (can be changed). As shown in FIG. 4, in the recipe RP, the step represented by the step number "001" is set as the constant concentration mode and the multiple steps represented by the step numbers "002", "003", and "004", respectively, are set as the concentration changing mode. The set concentration refers to a target value for a concentration of the processing liquid in the corresponding step. As shown in FIG. 4, individual set concentrations are set for the respective steps. The control unit 7 is configured to perform various controls using the aqueous solution regulating unit 72, the water regulating unit 73, and the liquid drain control unit 74 to regulate the concentration in each step to the corresponding set concentration.

The aqueous solution regulating unit 72 is configured to control the aqueous solution supply unit 43 (specifically, the flow rate controller 46 and the valve 62) to supply the phosphoric acid aqueous solution according to the recipe recorded in the recipe recording unit 71. To be more specific, the aqueous solution regulating unit 72 is configured to perform the first control in the constant concentration mode and the second control in the concentration changing mode. The aqueous solution regulating unit 72 performs the first control in the case where the current step is in the constant concentration mode and the second control in the case where the current step is in the concentration changing mode with reference to the recipe recorded in the recipe recording unit 71.

In the first control (performed by the aqueous solution regulating unit 72), the aqueous solution regulating unit 72 controls the aqueous solution supply unit 43 such that a phosphoric acid aqueous solution (e.g., 85 wt % of phosphoric acid aqueous solution) having a lower concentration than that of the phosphoric acid aqueous solution stored in the processing liquid storage unit 38 is supplied into the processing liquid storage unit 38. To be more specific, the aqueous solution regulating unit 72 opens the valve 62 of the aqueous solution supply unit 43 such that the water supplied from the water supply source 61 is flown into the flow path 43a through the flow path 60a. Thus, the phosphoric acid aqueous solution (diluted by the water flown into the flow path 43a through the flow path 60a) having a lower concentration than that of the phosphoric acid aqueous solution stored in the processing liquid storage unit 38 flows in the flow path 43a. The aqueous solution regulating unit 72 controls the flow rate controller 46 such that the concentration of the processing liquid becomes close to the set concentration based on the measurement value of the phosphoric acid concentration in the processing liquid obtained by the concentration meter 53 and the set concentration in the recipe recorded in the recipe recording unit 71. That is, the aqueous solution regulating unit 72 controls the flow rate controller 46 such that the phosphoric acid aqueous solution having an appropriate flow rate allowing the concentration of the processing liquid to be close to the set concentration is supplied into the processing liquid storage unit 38 through the flow path 43a.

In the second control (performed by the aqueous solution regulating unit 72), if predetermined conditions are satisfied, the aqueous solution regulating unit 72 controls the aqueous solution supply unit 43 such that a phosphoric acid aqueous solution (e.g., 93 wt % of phosphoric acid aqueous solution) having a higher concentration than that of the phosphoric acid aqueous solution stored in the processing liquid storage unit 38 in the constant concentration mode is supplied into the processing liquid storage unit 38. If the predetermined conditions are not satisfied, the aqueous solution regulating unit 72 performs the same control as, for example, the above-described first control even in the second control. Firstly, the aqueous solution regulating unit 72 compares the set concentration for the current step (the set concentration after the concentration change) with the set concentration for the step immediately before the current step ("one-preceding step") (the set concentration before the concentration change) to determine whether or not the set concentration for the current step is lower than the set concentration for the one-preceding step with reference to the recipe recorded in the recipe recording unit 71. If the aqueous solution regulating unit 72 determines that the set concentration for the current step is not lower than the set concentration for the one-preceding step (i.e., the set concentration for the current step is equal to or higher than the set concentration for the one-preceding step), the aqueous solution regulating unit 72 obtains the liquid surface height of the processing liquid in the outer tub 42 of the processing liquid storage unit 38 from the liquid surface sensor 80 and determines whether or not the liquid surface height is equal to or higher than a predetermined liquid surface reference value (a lower limit control starting value). The corresponding liquid surface reference value (the lower limit control starting value) is higher by a predetermined buffer than a liquid surface lower limit value which corresponds to a liquid surface height at which a temperature regulating function may be damaged when the liquid surface is lower than that. For example, the liquid surface reference value is previously calculated by adding a liquid surface height obtained from the voltage value measured by the liquid surface sensor 80 before the processing liquid storage unit 38 receives the substrate 8 to an increased liquid surface height depending on a number of substrates 8 received in the processing liquid storage unit 38.

If it is determined that the liquid surface height is not equal to or higher than the liquid surface reference value (the lower limit control starting value) (i.e., the liquid surface height is lower than the liquid surface reference value), the aqueous solution regulating unit 72 controls the aqueous solution supply unit 43 such that a phosphoric acid aqueous solution (e.g., 93 wt % of phosphoric acid aqueous solution) having a higher concentration than that of the phosphoric acid aqueous solution stored in the processing liquid storage unit 38 in the constant concentration mode is supplied into the processing liquid storage unit 38. That is, if the predetermined conditions are satisfied, i.e., "the set concentration for the current step is equal to or higher than the set concentration for the one-preceding step and the liquid surface height is lower than the liquid surface reference value", the aqueous solution regulating unit 72 controls the aqueous solution supply unit 43 such that a phosphoric acid aqueous solution having a higher concentration than that of the phosphoric acid aqueous solution stored in the processing liquid storage unit 38 in the constant concentration mode is supplied into the processing liquid storage unit 38.

To be more specific, the aqueous solution regulating unit 72 closes the valve 62 of the aqueous solution supply unit 43 in order for the water supplied from the water supply source 61 not to flow into the flow path 43*a* through the flow path 60*a*. Thus, the phosphoric acid aqueous solution having a higher concentration than that of the phosphoric acid aqueous solution stored in the processing liquid storage unit 38 in the constant concentration mode flows in the flow path 43*a*. Further, the aqueous solution regulating unit 72 controls the flow rate controller 46 such that the phosphoric acid aqueous solution is supplied into the processing liquid storage unit 38 from the flow path 43*a* at a predetermined flow rate. The aqueous solution regulating unit 72 continuously supplies the high-concentration phosphoric acid aqueous solution into the processing liquid storage unit 38 until the liquid surface height of the processing liquid obtained from the liquid surface sensor 80 becomes equal to or higher than the liquid surface reference value (the lower limit control starting value). If the liquid surface height of the processing liquid obtained from the liquid surface sensor 80 is equal to or higher than the liquid surface reference value (the lower limit control starting value), the aqueous solution regulating unit 72 determines whether or not the phosphoric acid concentration in the processing liquid obtained from the concentration meter 53 has reached the set concentration for the current step. If the phosphoric acid concentration in the processing liquid has reached the set concentration for the current step, the aqueous solution regulating unit 72 ends the second control. After the phosphoric acid concentration in the processing liquid has reached the set concentration, the aqueous solution regulating unit 72 performs, for example, the above-described first control.

The water regulating unit 73 controls the water supply unit 44 (specifically, the flow rate controller 48) such that water is supplied according to the recipe recorded in the recipe recording unit 71. To be more specific, the water regulating unit 73 is configured to perform the first control in the constant concentration mode and the second control in the concentration changing mode. The water regulating unit 73 is configured to perform the first control in the case where the current step is in the constant concentration mode and the second control in the case where the current step is in the concentration changing mode with reference to the recipe recorded in the recipe recording unit 71.

In the first control (performed by the water regulating unit 73), the water regulating unit 73 controls the flow rate controller 48 such that the concentration of the processing liquid becomes close to the set concentration based on the measurement value of the phosphoric acid concentration in the processing liquid obtained by the concentration meter 53 and the set concentration in the recipe recorded in the recipe recording unit 71. That is, the water regulating unit 73 controls the flow rate controller 48 such that the concentration of the processing liquid becomes close to the set concentration (i.e., the amount of pure water in the phosphoric acid aqueous solution becomes constant) and the water having an appropriate flow rate is supplied into the processing liquid storage unit 38.

In the second control (performed by the water regulating unit 73), the water regulating unit 73 controls the water supply unit 44 such that the amount of water to be supplied into the processing liquid storage unit 38 is changed depending on the set concentration in the recipe recorded in the recipe recording unit 71. The water regulating unit 73 compares the set concentration for the current step (the set concentration after the concentration change) with the set concentration for the one-preceding step (the set concentration before the concentration change) with reference to the recipe recorded in the recipe recording unit 71. If it is determined that the set concentration for the current step is equal to or higher than the set concentration for the one-preceding step, the water regulating unit 73 controls the flow rate controller 48 to decrease the supply amount of water. If the set concentration for the current step is lower than the set concentration for the one-preceding step, the water regulating unit 73 controls the flow rate controller 48 to increase the supply amount of water. The water regulating unit 73 determines whether or not the phosphoric acid concentration in the processing liquid obtained from the concentration meter 53 has reached the set concentration for the current step. If the phosphoric acid concentration in the processing liquid has reached the set concentration for the current step, the water regulating unit 73 ends the second control. After the phosphoric acid concentration in the processing liquid has reached the set concentration for the current step, the water regulating unit 73 performs, for example, the above-described first control.

The liquid drain control unit 74 controls the processing liquid drain unit 41 (specifically, the valve 41B) such that the processing liquid is drained from the processing tub 34 according to the recipe recorded in the recipe recording unit 71. To be more specific, the liquid drain control unit 74 is configured to perform the first control in the constant concentration mode and the second control in the concentration changing mode. The liquid drain control unit 74 is configured to perform the first control in the case where the current step is in the constant concentration mode and the second control in the case where the current step is in the concentration changing mode with reference to the recipe recorded in the recipe recording unit 71.

In the first control (performed by the liquid drain control unit 74), the liquid drain control unit 74 closes the valve 41B such that the processing liquid is not drained from, for example, the processing tub 34. Further, the liquid drain control unit 74 may slightly open the valve 41B in the first control to drain a small amount (as compared in the second control) of the processing liquid.

In the second control (performed by the liquid drain control unit 74), if predetermined conditions are satisfied, the liquid drain control unit 74 opens the valve 41B to start draining of the processing liquid from the processing tub 34. Further, "opening of the valve 41B to start the draining of the processing liquid" includes a case in which the fully closed valve 41B is opened as well as a case in which the slightly opened valve 41B is widely opened (i.e., increasing the liquid draining amount as compared in the first control). If the predetermined conditions are not satisfied, the liquid drain control unit 74 performs the same control as, for example, the above-described first control even in the second control.

Firstly, the liquid drain control unit 74 compares the set concentration for the current step (the set concentration after the concentration change) with the set concentration for the one-preceding step (the set concentration before the concentration change) to determine whether or not the set concentration for the current step is lower than the set concentration for the one-preceding step with reference to the recipe recorded in the recipe recording unit 71. If it is determined that the set concentration for the current step is lower than the set concentration for the one-preceding step, the liquid drain control unit 74 obtains the liquid surface height of the processing liquid in the outer tub 42 of the processing liquid storage unit 38 from the liquid surface sensor 80 and determines whether or not the liquid surface height is higher than a predetermined liquid surface reference value (an upper limit control starting value). The corresponding liquid surface reference value (the upper limit control starting value) is lower by a predetermined buffer than a liquid surface upper limit value which corresponds to a liquid surface height at which the phosphoric acid aqueous solution is likely to be overflown from the processing liquid storage unit 38 when the liquid surface is higher than that.

If it is determined that the liquid surface height is higher than the liquid surface reference value (the upper limit control starting value), the liquid drain control unit 74 controls the processing liquid drain unit 41 to start the draining of the processing liquid. That is, if the predetermined conditions are satisfied, i.e., "the set concentration for the current step is lower than the set concentration for the one-preceding step and the liquid surface height is higher than the liquid surface reference value", the liquid drain control unit 74 controls the processing liquid drain unit 41 to start the draining of the processing liquid.

To be more specific, the liquid drain control unit 74 opens the valve 41B to start the draining of the processing liquid from the processing tub 34. Thus, in the case of lowering the concentration, when the supply amount of water into the processing liquid storage unit 38 is increased under the control of the water regulating unit 73 and the liquid surface height in the processing liquid storage unit 38 is increased, a further increase in the liquid surface height is suppressed. The liquid drain control unit 74 continuously drains the processing liquid from the processing tub 34 until the liquid surface height of the processing liquid, which is obtained from the liquid surface sensor 80, becomes equal to or lower than the liquid surface reference value (the upper limit control starting value). If the liquid surface height of the processing liquid obtained from the liquid surface sensor 80 is equal to or lower than the liquid surface reference value (the upper limit control starting value), the liquid drain control unit 74 determines whether or not the phosphoric acid concentration in the processing liquid obtained from the concentration meter 53 has reached the set concentration for the current step. If the phosphoric acid concentration in the processing liquid has reached the set concentration for the current step, the liquid drain control unit 74 ends the second control. After the phosphoric acid concentration in the processing liquid has reached the set concentration, the liquid drain control unit 74 performs, for example, the above-described first control.

[Substrate Liquid Processing Method]

Figure 5:
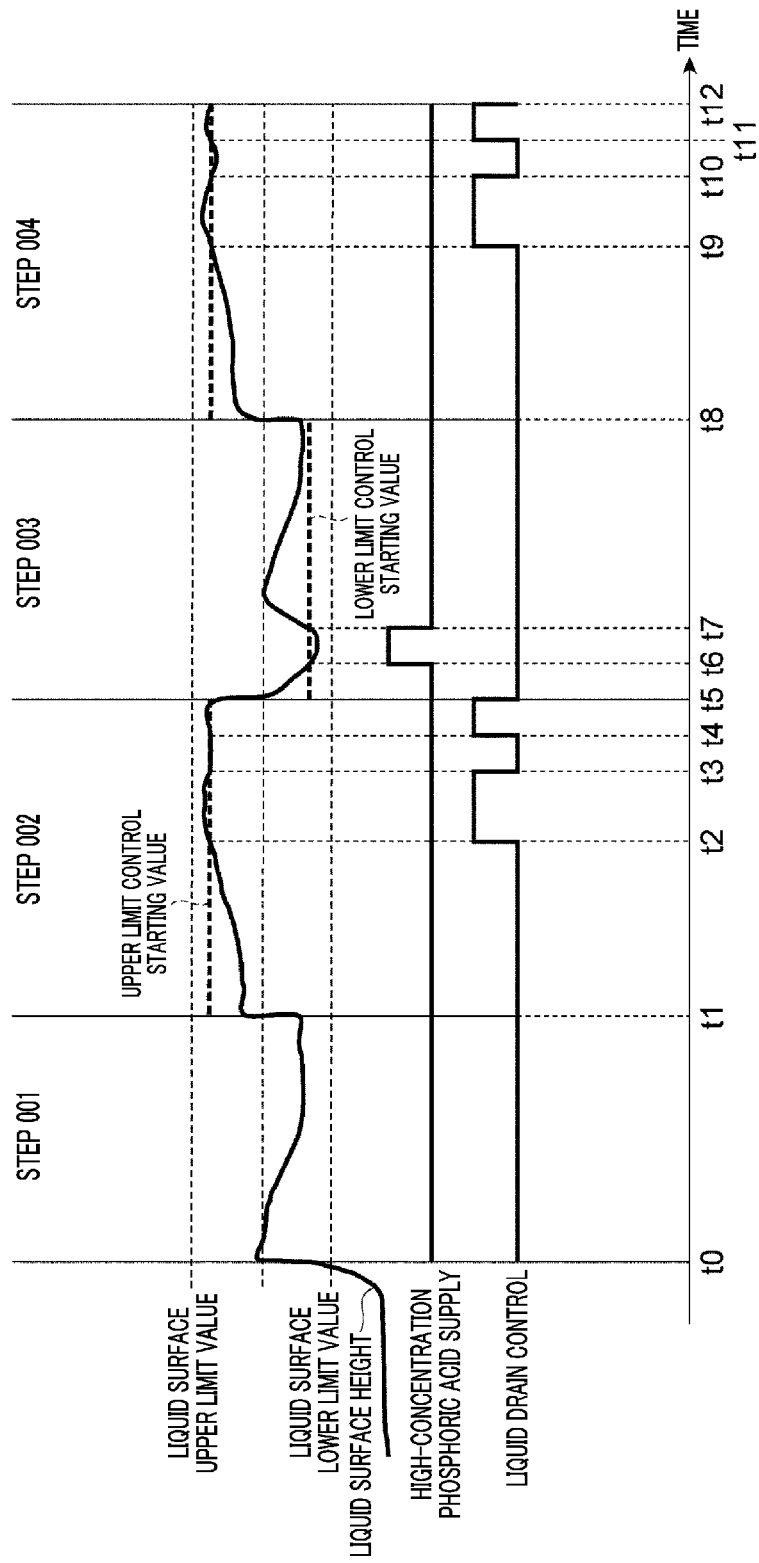
FIG. 5 is a time chart of a substrate liquid processing.
Figure 6:
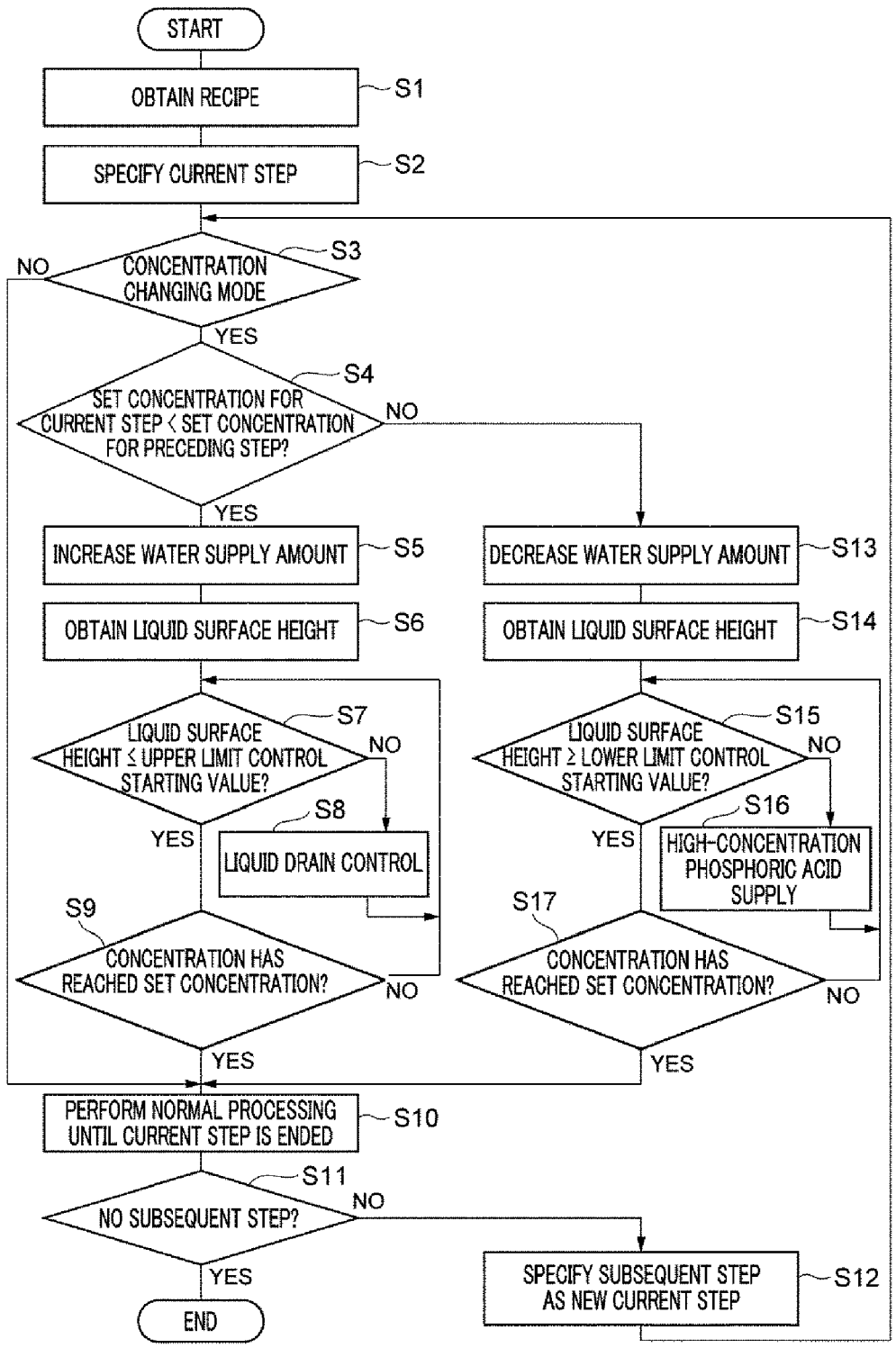
FIG. 6 is a flowchart of a substrate liquid processing.

Now, an example of a substrate liquid processing method will be described with reference to a time chart of FIG. 5 and a flowchart of FIG. 6. Firstly, the processing images including consecutive multiple steps will be described with reference to the time chart of FIG. 5. FIG. 5 illustrates that the consecutive multiple steps (multiple steps represented by step numbers "001", "002", "003", and "004", respectively) are performed in a time series. The steps illustrated in FIG. 5 correspond to the respective steps of the recipe RP illustrated in FIG. 4 and are within a substrate processing period during which the substrate 8, which is the processing target, is immersed in the processing liquid in the processing liquid storage unit 38 to be processed with the processing liquid. Only the step represented by the step number "001" is in the constant concentration mode and the other steps represented by the step numbers "002", "003", and "004", respectively, are in the concentration changing mode. Further, the set concentration for the steps represented by the step numbers "001" and "003", respectively, is "88.5 wt %" and the set concentration for the steps represented by the step numbers "002" and "004" is "86 wt %". Further, in the following description, the steps with the step numbers "001" to "004" will be described as the step 001 to step 004, respectively.

As shown in FIG. 5, the step 001 is first started at a time t0. In the step 001 of the constant concentration mode, the control unit 7 performs the first control to regulate the concentration of the processing liquid in the processing liquid storage unit 38 to a constant level (88.5 wt %). Then, the step 001 is ended and the step 002 is started at a time t1. The step 002 is in the concentration changing mode and the set concentration is 86 wt %. In this way, if the set concentration for the step 002 as the current step is lower than the set concentration for the step 001 as the one-preceding step, the control unit 7 controls the flow rate controller 48 to increase the supply amount of water. Therefore, in the step 002, the liquid surface height in the processing liquid storage unit 38 is gradually increased with a lapse of time.

Then, if the liquid surface height becomes higher than the liquid surface reference value (the upper limit control starting value) at a time t2, the control unit 7 opens the valve 41B to start the draining of the processing liquid (drain control). This drain control is continuously performed until the liquid surface height becomes equal to or lower than the liquid surface reference value (the upper limit control starting value) at a time t3. Even if the drain control is ended once, since the supply amount of water is set to be large until the concentration reaches the set concentration, the liquid surface height becomes higher than the liquid surface reference value (the upper limit control starting value) again at a time t4. In this case, the drain control is performed repeatedly until the liquid surface height becomes equal to or lower than the liquid surface reference value (the upper limit control starting value).

Then, the liquid surface height becomes equal to or lower than the liquid surface reference value (the upper limit control starting value) at a time t5, and the step 002 is ended and the step 003 is started. The step 003 is in the concentration changing mode and the set concentration is 88.5 wt %. In this away, if the set concentration for the step 003 as the current step is higher than the set concentration for the step 002 as the one-preceding step, the control unit 7 controls the flow rate controller 48 to decrease the supply amount of water. Therefore, in the step 003, a liquid surface height in the processing liquid storage unit 38 is gradually decreased with a lapse of time.

Then, if the liquid surface height becomes lower than the liquid surface reference value (the lower limit control starting value) at a time t6, the control unit 7 closes the valve 62 of the aqueous solution supply unit 43 to supply the high-concentration phosphoric acid aqueous solution into the processing liquid storage unit 38 (high-concentration phosphoric acid supply). This high-concentration phosphoric acid supply is continuously performed until the liquid surface height becomes equal to or higher than the liquid surface reference value (the lower limit control starting value) at a time t7.

Then, the step 003 is ended and the step 004 is started at a time t8. The step 004 is in the concentration changing mode and the set concentration is 86 wt %. In this away, if the set concentration for the step 004 as the current step is lower than the set concentration for the step 003 as the one-preceding step, the control unit 7 controls the flow rate controller 48 to increase the supply amount of water. Therefore, in the step 004, a liquid surface height in the processing liquid storage unit 38 is gradually increased with a lapse of time. Then, if the liquid surface height becomes higher than a liquid surface reference value (an upper limit control starting value) at a time t9, the control unit 7 opens the valve 41B to start draining of the processing liquid (drain control). This drain control is continuously performed until the liquid surface height becomes equal to or lower than the liquid surface reference value (the upper limit control starting value) at a time t10. Even if the drain control is ended once, since the supply amount of water is set to be large until the concentration reaches the set concentration, the liquid surface height becomes higher than the liquid surface reference value (the upper limit control starting value) again at a time t11. In this case, the drain control is performed repeatedly until the liquid surface height becomes equal to or lower than the liquid surface reference value (the upper limit control starting value). The liquid surface height becomes equal to or lower than the liquid surface reference value (the upper limit control starting value), and the step 004 is ended at a time t12. Further, in a period (an interval period) during which the steps within the substrate processing period are ended and the substrate 8 is not immersed in the processing liquid in the processing liquid storage unit 38, the control unit 7 regulates the concentration of the processing liquid in the processing liquid storage unit 38 to be the concentration equal to the set concentration in the above-described constant concentration mode. Therefore, if the set concentration in the constant concentration mode is changed, the concentration of the processing liquid in the constant concentration mode before the interval period becomes different from the concentration of the processing liquid in the constant concentration mode within a next substrate processing period.

Now, details of a processing of the control unit 7 in a step 1 will be described with reference to the flowchart of FIG. 6. As shown in FIG. 6, firstly, the control unit 7 (specifically, the aqueous solution regulating unit 72, the water regulating unit 73, and the liquid drain control unit 74) obtains the recipe (e.g., the recipe RP shown in FIG. 4) recorded in the recipe recording unit 71 (process S1) and specifies the current step (process S2).

Then, the control unit 7 determines whether or not the specified current step is in the concentration changing mode (process S3). In the process S3, if the current step is not in the concentration changing mode, the control unit 7 performs the first control in the constant concentration mode in which the concentration of the processing liquid is regulated to be constant until the current step is ended (process S10).

Meanwhile, in the process S3, if it is determined that the current step is in the concentration changing mode, the control unit 7 performs the second control to enable the concentration of the processing liquid to be changed. To be more specific, the control unit 7 compares the set concentration for the current step (the set concentration after the concentration change) with the set concentration for the one-preceding step (the set concentration before the concentration change) to determine whether or not the set concentration for the current step is lower than the set concentration for the one-preceding step (process S4).

In the process S4, if it is determined that the set concentration for the current step is lower than the set concentration for the one-preceding step, the control unit 7 (specifically, the water regulating unit 73) controls the flow rate controller 48 to increase the supply amount of water into the processing liquid storage unit 38 and decrease the concentration of the processing liquid in the processing liquid storage unit 38 (process S5). Further, the control unit 7 (specifically, the liquid drain control unit 74) obtains the liquid surface height of the processing liquid in the outer tub 42 of the processing liquid storage unit 38 from the liquid surface sensor 80 (process S6).

Then, the control unit 7 (specifically, the liquid drain control unit 74) determines whether or not the obtained liquid surface height is equal to or lower than the predetermined liquid surface reference value (the upper limit control starting value) (process S7). In the process S7, if it is determined that the liquid surface height is not equal to or lower than the predetermined liquid surface reference value (the upper limit control starting value) (i.e., the liquid surface height is higher than the predetermined liquid surface reference value (the upper limit control starting value)), the control unit 7 (specifically, the liquid drain control unit 74) starts the drain control (process S8). To be more specific, the control unit 7 opens the valve 41B to start the draining of the processing liquid from the processing tub 34. The control unit 7 performs the drain control for a predetermined time period in the process S8 and then performs the processing of the process S7 again.

Meanwhile, in the process S7, if it is determined that the liquid surface height is equal to or lower than the predetermined liquid surface reference value (the upper limit control starting value), the control unit 7 does not perform the above-described drain control but determines whether or not the phosphoric acid concentration in the processing liquid, which is obtained from the concentration meter 53, has reached the set concentration for the current step (process S9). In the process S9, if it is determined that the phosphoric acid concentration in the processing liquid has not reached the set concentration for the current step, the processing of the process S7 is performed again. In the process S9, if it is determined that the phosphoric acid concentration in the processing liquid has reached the set concentration for the current step, the control unit 7 performs the first control of the constant concentration mode in which the concentration of the processing liquid is regulated to be constant until the current step is ended (process S10).

In the process S4, if it is determined that the set concentration for the current step is not lower than the set concentration for the one-preceding step, the control unit 7 (specifically, the water regulating unit 73) controls the flow rate controller 48 to decrease the supply amount of water into the processing liquid storage unit 38 and thus increase the concentration of the processing liquid in the processing liquid storage unit 38 (process S13). In this case, the control unit 7 (specifically, the liquid drain control unit 74) may open the valve 41B to start the draining of the processing liquid from the processing tub 34. The control unit 7 (specifically, the aqueous solution regulating unit 72) obtains the liquid surface height of the processing liquid in the outer tub 42 of the processing liquid storage unit 38 from the liquid surface sensor 80 (process S14).

Then, the control unit 7 (specifically, the aqueous solution regulating unit 72) determines whether or not the obtained liquid surface height is equal to or higher than the predetermined liquid surface reference value (the lower limit control starting value) (process S15). In the process S15, if it is determined that the liquid surface height is not equal to or higher than the predetermined liquid surface reference value (the lower limit control starting value) (i.e., the liquid surface height is lower than the predetermined liquid surface reference value (the lower limit control starting value)), the control unit 7 (specifically, the aqueous solution regulating unit 72) starts the high-concentration phosphoric acid supply (process S16). To be more specific, the control unit 7 closes the valve 62 of the aqueous solution supply unit 43 to supply the high-concentration phosphoric acid aqueous solution into the processing liquid storage unit 38. The control unit 7 performs the high-concentration phosphoric acid supply for a predetermined time period in the process S16 and then performs the processing of the process S15 again.

Meanwhile, in the process S15, if it is determined that the liquid surface height is equal to or higher than the predetermined liquid surface reference value (the lower limit control starting value), the control unit 7 does not perform the above-described high-concentration phosphoric acid supply but determines whether or not the phosphoric acid concentration in the processing liquid, which is obtained from the concentration meter 53, has reached the set concentration for the current step (process S17). In the process S17, if it is determined that the phosphoric acid concentration in the processing liquid has not reached the set concentration for the current step, the processing of the process S15 is performed again. In the process S17, if it is determined that the phosphoric acid concentration in the processing liquid has reached the set concentration for the current step, the control unit 7 performs the first control of the constant concentration mode in which the concentration of the processing liquid is regulated to be constant until the current step is ended (process S10).

If the process S10 is completed (i.e., the current step is completed), the control unit 7 determines whether there is a subsequent step with reference to the recipe (process S11). In the process S11, if it is determined that there is a subsequent step, the control unit 7 specifies the subsequent step as a new current step (process S12) and performs the processings after the process S3 again. Meanwhile, in the process S11, if it is determined that there is no subsequent step (i.e., all the steps in the recipe are completed), a series of processings is ended.

[Operation Effect]

In the substrate liquid processing apparatus, if the phosphoric acid concentration of the phosphoric acid aqueous solution used as the processing liquid is changed, the water amount in the processing liquid storage unit is changed, and, thus, the liquid surface height is increased or decreased. For example, when lowering the phosphoric acid concentration of the phosphoric acid aqueous solution used as the processing liquid, the supply amount of the water in the processing liquid storage unit is increased. Thus, the liquid surface height in the processing liquid storage unit is increased, so that the phosphoric acid aqueous solution is likely to be overflown from the processing liquid storage unit. Therefore, it may not be possible to appropriately perform the concentration change of the processing liquid (specifically, the concentration change in case of decreasing the concentration).

In this regard, the substrate liquid processing apparatus A1 is equipped with the processing liquid storage unit 38 configured to store the processing liquid; the processing liquid drain unit 41 configured to drain the processing liquid from the processing liquid storage unit 38; and the control unit 7 configured to control the processing liquid drain unit 41. Further, the control unit 7 performs the first control in the constant concentration period during which the concentration of the processing liquid in the processing liquid storage unit 38 is regulated to the predetermined set concentration; and the second control in the concentration changing period during which the concentration of the processing liquid in the processing liquid storage unit 38 is changed. In the second control, the control unit 7 compares the set concentration after the concentration change with the set concentration before the concentration change, and if the set concentration after the concentration change is lower than the set concentration before the concentration change, the control unit 7 controls the processing liquid drain unit 41 to start the draining of the processing liquid.

According to the substrate liquid processing apparatus A1, in the second control of the concentration changing mode, if the set concentration after the concentration change becomes lower than the set concentration before the concentration change, the draining of the phosphoric acid aqueous solution used as the processing liquid is started. For this reason, even if the supply amount of water into the processing liquid storage unit 38 is increased when the phosphoric acid concentration is decreased, the phosphoric acid aqueous solution is drained from the processing liquid storage unit 38. Thus, it is possible to suppress the increase in the liquid surface height in the processing liquid storage unit 38 and thus possible to suppress the phosphoric acid aqueous solution from being overflown from the processing liquid storage unit 38. As stated above, in the substrate liquid processing apparatus A1 according to the present exemplary embodiment, it is possible to appropriately perform the concentration change of the processing liquid (specifically, the concentration change in case of decreasing the concentration).

The substrate liquid processing apparatus A1 is further equipped with the liquid surface sensor 80 configured to detect the liquid surface height in the processing liquid storage unit 38. In the second control, if the set concentration after the concentration change is lower than the set concentration before the concentration change and the liquid surface height detected by the liquid surface sensor 80 is higher than the predetermined liquid surface reference value, the control unit 7 controls the processing liquid drain unit 41 to start the draining of the processing liquid. Thus, the draining of the processing liquid can be started based on the actual increase in the liquid surface height caused by the supply of water to decrease the concentration. Therefore, it is possible to start the draining of the processing liquid at an appropriate timing and thus possible to more securely suppress the processing liquid from being overflown.

The concentration changing mode may include multiple steps in which individual set concentrations can be set. Since the set concentrations are set for each multiple step of the concentration changing mode, it is possible to more delicately set the concentration depending on each processing in the concentration changing mode.

Here, in the substrate liquid processing apparatus, if the phosphoric acid concentration of the phosphoric acid aqueous solution used as the processing liquid is increased, the supply amount of water into the processing liquid storage unit is decreased and the water is evaporated. It takes some time to evaporate the water to increase the concentration. Therefore, it may not be possible to appropriately perform the concentration change of the processing liquid (specifically, the concentration change in case of increasing the concentration).

In this regard, the substrate liquid processing apparatus A1 is equipped with the processing liquid supply unit 39 which functions as the concentration increase promoting unit to promote the increase in the concentration of the processing liquid in the processing liquid storage unit 38. Further, the control unit 7 performs the first control of the constant concentration mode in which the concentration of the processing liquid in the processing liquid storage unit 38 is regulated to the predetermined set concentration; and the second control of the concentration changing mode in which the concentration of the processing liquid in the processing liquid storage unit 38 is changed. In the second control, the control unit 7 compares the set concentration after the concentration change with the set concentration before the concentration change, and if the set concentration after the concentration change is higher than the set concentration before the concentration change, the control unit 7 controls the processing liquid supply unit 39 to promote the increase in the concentration of the processing liquid in the processing liquid storage unit 38.

According to the substrate liquid processing apparatus A1, in the second control of the concentration changing mode, if the set concentration after the concentration change becomes higher than the set concentration before the concentration change, the increase in the concentration of the processing liquid is promoted by the processing liquid supply unit 39 which functions as the concentration increase promoting unit. Therefore, it is possible to reduce time required to increase the concentration as compared to the case where the water is simply evaporated. As stated above, in the substrate liquid processing apparatus A1 according to the present exemplary embodiment, it is possible to appropriately perform the concentration change of the processing liquid (specifically, the concentration change in case of increasing the concentration).

To be more specific, the processing liquid supply unit 39 which functions as the concentration increase promoting unit supplies a processing liquid having a higher concentration than that of the processing liquid stored in the processing liquid storage unit 38 into the processing liquid storage unit 38 to promote the increase in the concentration of the processing liquid in the processing liquid storage unit 38. In case of increasing the concentration, the liquid surface height in the processing liquid storage unit 38 is decreased by the evaporation of the water, and, thus, the temperature regulating function (circulation temperature control) of the substrate liquid processing apparatus may be deteriorated. In this regard, since the high-concentration processing liquid is supplied into the processing liquid storage unit 38, it is possible to appropriately increase the concentration and also possible to suppress the decrease in the liquid surface height (i.e., deterioration in the temperature regulating function).

The control unit 7 performs the first control and the second control within the substrate processing period during which the substrate 8, which is the processing target, is immersed in the processing liquid in the processing liquid storage unit 38 to be processed with the processing liquid. Further, in the interval period during which the substrate 8 is not immersed in the processing liquid in the processing liquid storage unit 38, the control unit 7 regulates the concentration of the processing liquid in the processing liquid storage unit 38 to the predetermined set concentration in the constant concentration mode. Therefore, it is possible to appropriately change the concentration of the processing liquid in the substrate processing period and also possible to appropriately regulate the concentration to the predetermined set concentration in the interval period.

So far, the exemplary embodiment has been described. However, the present disclosure is not limited to the exemplary embodiment.

Figure 7:
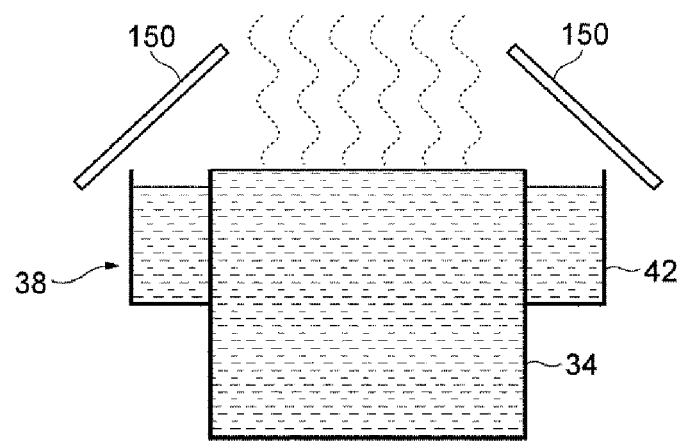
FIG. 7 is a schematic diagram illustrating a configuration of a concentration increase promoting unit according to a modification example.

The processing liquid supply unit 39 has been described as an example of the concentration increase promoting unit, and there has been described the example in which the increase in the concentration of the processing liquid in the processing liquid storage unit 38 is promoted by supplying the high-concentration processing liquid from the processing liquid supply unit 39. However, the configuration of the concentration increase promoting unit is not limited thereto. In a general etching apparatus, an etching processing is performed on a substrate in a state where the substrate is immersed in a processing liquid within a processing tub and an upper portion of a processing liquid storage unit is closed with a cover (a bus lid). During the etching processing, the bus lid typically needs to be closed to stabilize a temperature. The bus lid is closed typically and opened only when the substrate is immersed in the processing liquid. In this regard, for example, as shown in FIG. 7, a bus lid 150 is opened even in the interval period between the processings in which any processing is not performed. Thus, it is possible to increase the evaporation amount of water as compared in the case where the bus lid 150 is closed. Therefore, it is possible to promote the increase in the concentration of the processing liquid and thus possible to more appropriately perform the concentration change of the processing liquid (specifically, the concentration change in case of increasing the concentration).

Figure 8:
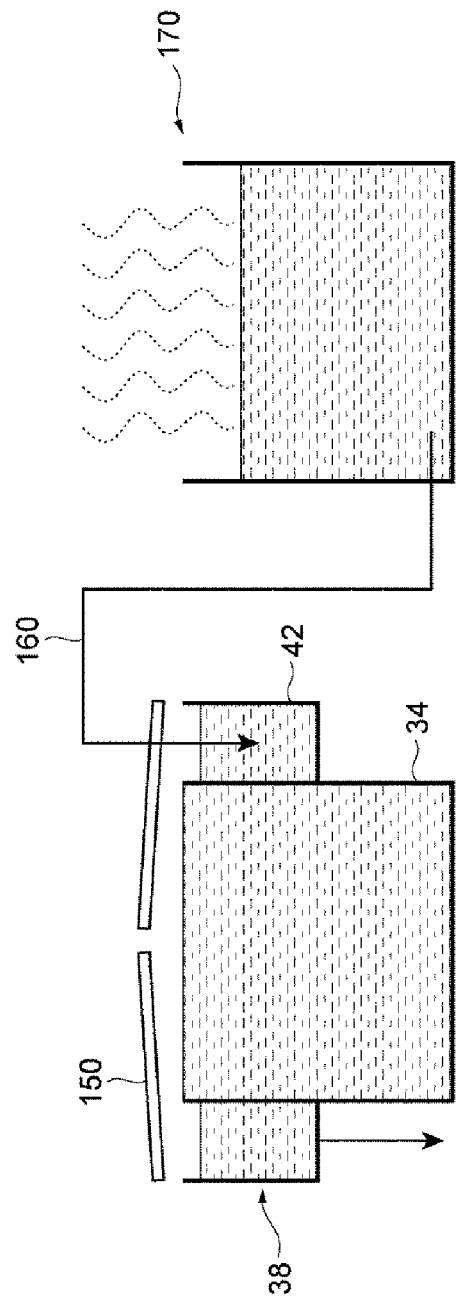
FIG. 8 is a schematic diagram illustrating a configuration of a concentration increase promoting unit according to another modification example.

Further, in the above-described exemplary embodiment, the configuration in which the opening/closing of the valve 62 of the aqueous solution supply unit 43 is switched to easily supply the phosphoric acid aqueous solution having the normal concentration and the phosphoric acid aqueous solution having the high concentration into the processing liquid storage unit 38 has been described as a configuration of the concentration increase promoting unit. However, the configuration in which the high-concentration phosphoric acid aqueous solution is supplied is not limited thereto. For example, as shown in FIG. 8, a configuration in which a high-concentration processing liquid storage unit 170 configured to store the high-concentration phosphoric acid aqueous solution is provided outside the processing liquid storage unit 38 and a processing liquid with an increased concentration is supplied from the high-concentration processing liquid storage unit 170 into the processing liquid storage unit 38 through a flow path 160 may be adopted. Even in this configuration, it is possible to appropriately supply the high-concentration phosphoric acid aqueous solution to appropriately increase the concentration and suppress the decrease in the liquid surface height (i.e., deterioration of the temperature regulating function). Further, the high-concentration processing liquid storage unit 170 illustrated in FIG. 8 may be configured to allow the phosphoric acid aqueous solution to be maintained at a high temperature by heating the phosphoric acid aqueous solution. Thus, the high-temperature and the high-concentration phosphoric acid aqueous solution is supplied into the processing liquid storage unit 38, and, thus, it is possible to reduce time required to heat the processing liquid. Further, in the above-described exemplary embodiment, the processing liquid drain unit 41 is provided in the processing liquid storage unit 38. However, the arrangement of the processing liquid drain unit is not limited thereto and may be provided by being branched from the processing liquid circulation unit 40. Furthermore, the processing liquid storage unit 38 includes the processing tub 34 and the outer tub 42. However, the configuration of the processing liquid storage unit is not limited thereto. For example, the processing liquid storage unit may be implemented by connecting the processing tub 34 to the aqueous solution supply unit, the water supply unit and the drain unit, and the outer tub may be omitted.

[Specific Example of Configuration Including High-Concentration Processing Liquid Storage Unit]

Figure 9:
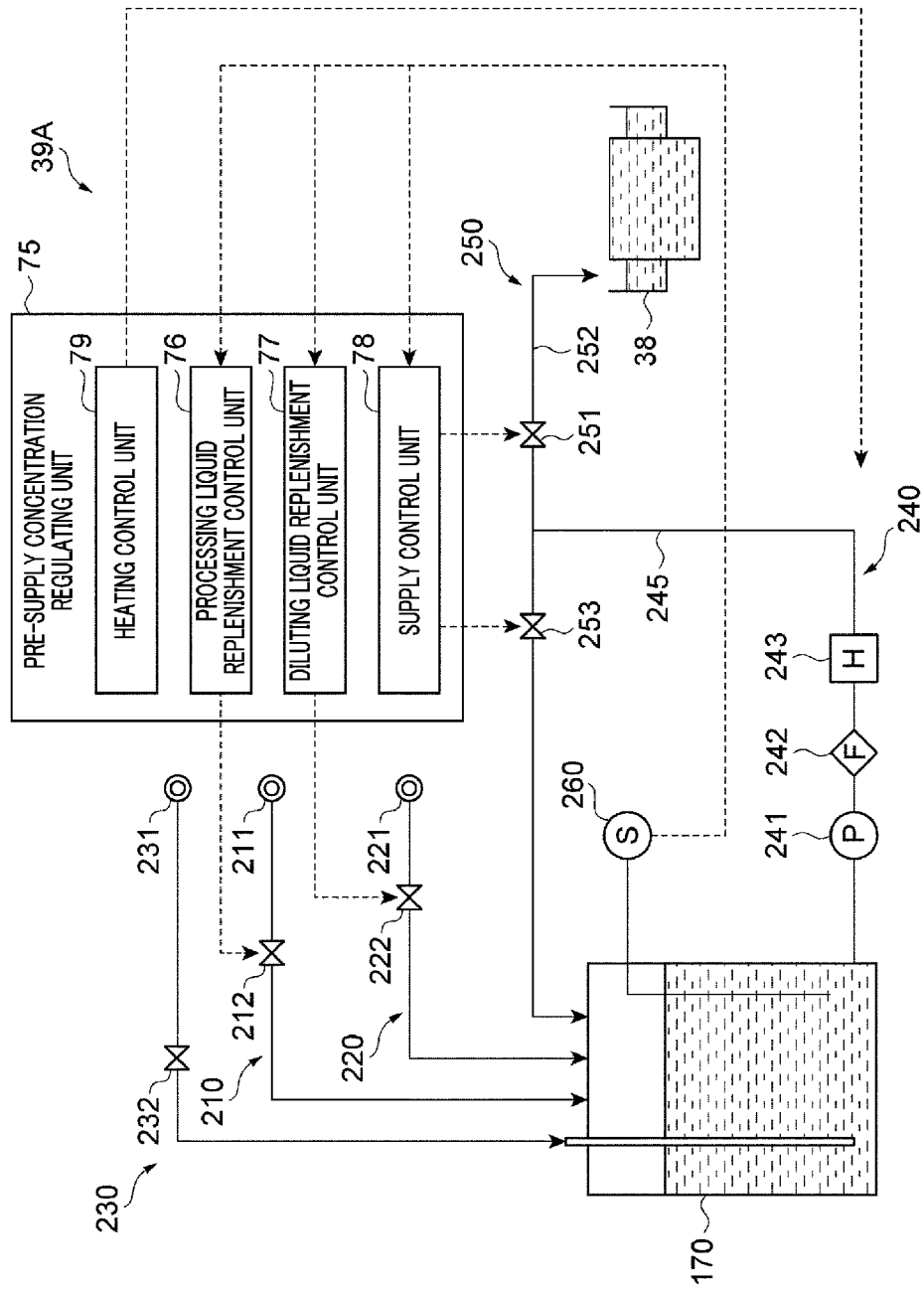
FIG. 9 is a schematic diagram illustrating a more detailed configuration example of the concentration increase promoting unit of FIG. 8.

Now, the configuration of the concentration increase promoting unit including the high-concentration processing liquid storage unit 170 will be described in more detail. A concentration increase promoting unit 39A illustrated in FIG. 9 is configured to supply a high-concentration processing liquid into a liquid processing unit (e.g., the processing liquid storage unit 38) in which a processing liquid and a substrate, which is a target to be immersed in the processing liquid, are received. For example, the concentration increase promoting unit 39A is equipped with the high-concentration processing liquid storage unit 170, a processing liquid replenishing unit 210, a diluting liquid replenishing unit 220, a gas supply unit 230, a heating unit 240, a processing liquid supply unit 250, and a concentration sensor 260.

As described above, the high-concentration processing liquid storage unit 170 (supply liquid storage unit) is configured to store the processing liquid to be supplied into the processing liquid storage unit 38. The high-concentration processing liquid storage unit 170 is provided away from the processing liquid storage unit 38.

The processing liquid replenishing unit 210 is configured to replenish the high-concentration processing liquid storage unit 170 with the processing liquid (e.g., the phosphoric acid aqueous solution). For example, the processing liquid replenishing unit 210 has a processing liquid supply source 211 and a valve 212. The processing liquid supply source 211 has a tank (not shown) for the processing liquid to be replenished and a pump (not shown) configured to force-feed the processing liquid from the tank to the high-concentration processing liquid storage unit 170. The valve 212 is configured to open/close a flow path for the processing liquid fed from the processing liquid supply source 211 to the high-concentration processing liquid storage unit 170 in response to a control instruction.

The diluting liquid replenishing unit 220 is configured to replenish the high-concentration processing liquid storage unit 170 with a diluting liquid (e.g., pure water, deionized water, or the like) having a lower concentration than that of the processing liquid replenished into the high-concentration processing liquid storage unit 170 by the processing liquid replenishing unit 210. The lower concentration than that of the processing liquid means that a concentration of a component contributing to a processing content targeted by the processing liquid is low. For example, the diluting liquid replenishing unit 220 has a diluting liquid supply source 221 and a valve 222. The diluting liquid supply source 221 has, for example, a tank (not shown) for the diluting liquid to be replenished and a pump (not shown) configured to force-feed the diluting liquid from the tank to the high-concentration processing liquid storage unit 170. The valve 222 is configured to open/close a flow path for the diluting liquid fed from the diluting liquid supply source 221 to the high-concentration processing liquid storage unit 170 in response to a control command.

The gas supply unit 230 is configured to supply an inert gas (e.g., a nitrogen gas) for promoting the water evaporation into the processing liquid from a lower portion of the high-concentration processing liquid storage unit 170. If the gas supply unit 230 supplies the inert gas, air bubbles are generated in the processing liquid, and, thus, a contact area between the processing liquid and the gas is increased. For this reason, the evaporation of water in the processing liquid is promoted. For example, the gas supply unit 230 has a gas supply source 231 and a valve 232. For example, the gas supply source 231 has a tank (not shown) for a compressed inert gas. The valve 232 is configured to open/close a flow path for the inert gas supplied from the gas supply source 231 to the high-concentration processing liquid storage unit 170 in response to a control command.

The heating unit 240 is configured to heat the processing liquid in the high-concentration processing liquid storage unit 170. The heating unit 240 may be configured to heat the processing liquid drained from the lower portion of the high-concentration processing liquid storage unit 170 to return the processing liquid to an upper portion of the high-concentration processing liquid storage unit 170. For example, the heating unit 240 has a flow path 245, a pump 241, a filter 242, and a heater 243. The flow path 245 is configured to drain the processing liquid from the lower portion of the high-concentration processing liquid storage unit 170 to introduce the processing liquid to the upper portion of the high-concentration processing liquid storage unit 170. The pump 241, the filter 242, and the heater 243 are provided at the flow path 245. The pump 241 is configured to force-feed the processing liquid from a lower side toward an upper side of the high-concentration processing liquid storage unit 170. The filter 242 is configured to remove foreign materials in the processing liquid. The heater 243 is configured to heat the processing liquid.

The processing liquid supply unit 250 is configured to supply the processing liquid from the high-concentration processing liquid storage unit 170 into the processing liquid storage unit 38. For example, the processing liquid supply unit 250 has a flow path 252 and valves 251 and 253. The flow path 252 is branched from the flow path 245 at a downstream side (i.e., the upper side of the high-concentration processing liquid storage unit 170) of the pump 241, the filter 242, and the heater 243 and configured to induce the processing liquid from the flow path 245 to the processing liquid storage unit 38. The valve 251 is configured to open/close the flow path 252 in response to a control command. The valve 253 is placed between the flow path 252 and the upper portion of the high-concentration processing liquid storage unit 170 and configured to open/close the flow path 245. In a state where the valve 251 closes the flow path 252 and the valve 253 opens the flow path 245, the processing liquid force-fed by the pump 241 is returned from the lower portion toward the upper portion of the high-concentration processing liquid storage unit 170. Hereinafter, this state will be referred to as "circulation state". Meanwhile, in a state where the valve 251 opens the flow path 252 and the valve 253 closes the flow path 245, the processing liquid force-fed by the pump 241 is supplied into the processing liquid storage unit 38. Hereinafter, this state will be referred to as "supply state".

The concentration sensor 260 is configured to detect information about the concentration of the processing liquid in the high-concentration processing liquid storage unit 170. The concentration sensor 260 may detect information about the liquid surface height of the processing liquid in the high-concentration processing liquid storage unit 170 as the information about the concentration of the processing liquid. For example, the liquid surface height of the processing liquid is changed by the replenishment of the processing liquid from the processing liquid replenishing unit 210, the replenishment of the diluting liquid from the diluting liquid replenishing unit 220, the evaporation of water in the processing liquid, and the supply of the processing liquid from the high-concentration processing liquid storage unit 170 into the processing liquid storage unit 38. Thus, in the state where the replenishment of the processing liquid by the processing liquid replenishing unit 210 is stopped and the circulation state is maintained, the liquid surface height of the processing liquid is decreased mainly by evaporation of water. Therefore, the decrease in the liquid surface height of the processing liquid is correlated with the increase in the concentration of the processing liquid. Likewise, in the state where the replenishment of the processing liquid by the processing liquid replenishing unit 210 is stopped and the circulation state is maintained, the liquid surface height of the processing liquid is increased mainly by the replenishment of the diluting liquid. Therefore, the increase in the liquid surface height of the processing liquid is correlated with the decrease in the concentration of the processing liquid. In this way, in the state where the replenishment of the processing liquid by the processing liquid replenishing unit 210 is stopped and the circulation state is maintained, information about the concentration of the processing liquid may be the liquid surface height of the processing liquid.

Figure 10:
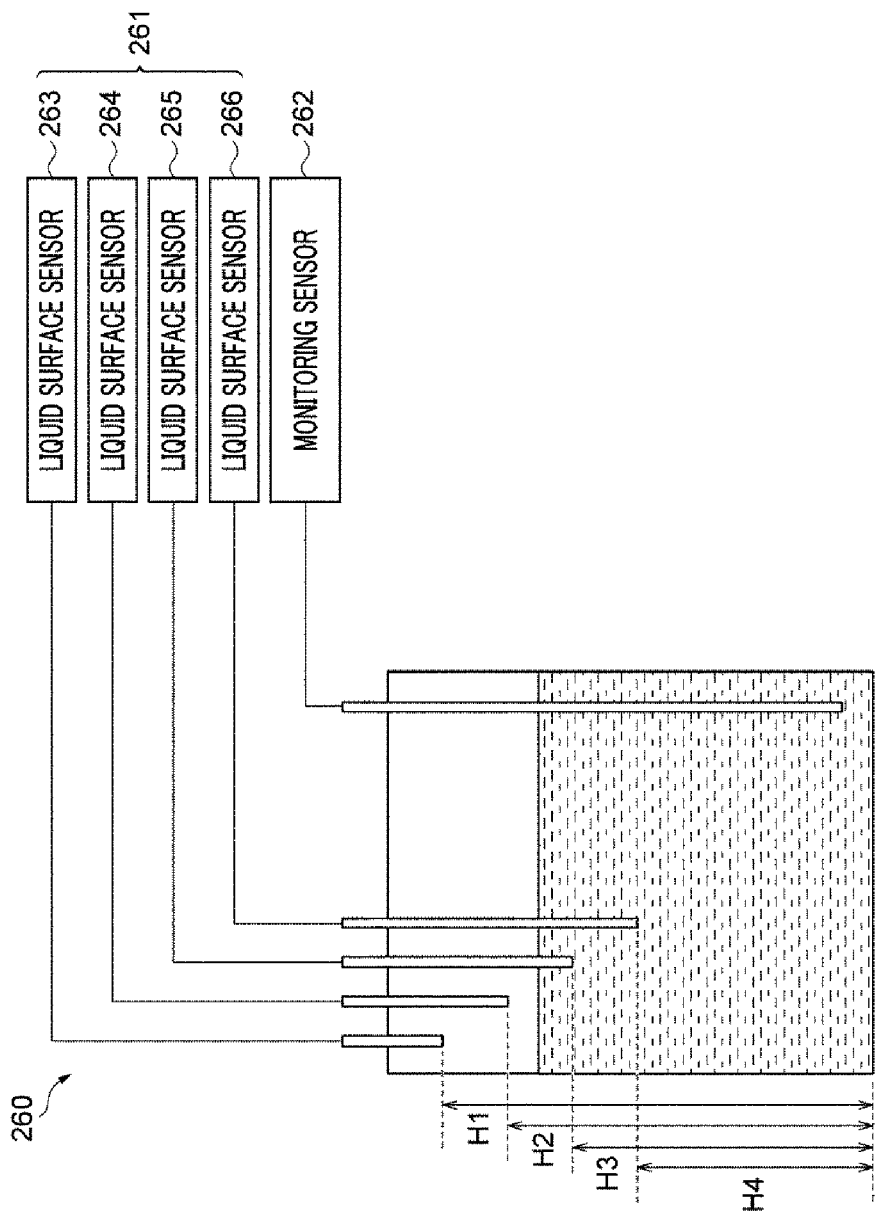
FIG. 10 is a schematic diagram illustrating a detailed example of a concentration sensor.

As shown in FIG. 10, for example, the concentration sensor 260 has a control sensor 261 and a monitoring sensor 262. The control sensor 261 is configured to detect information for controlling the processing liquid replenishing unit 210, the diluting liquid replenishing unit 220, the processing liquid supply unit 250, and the like. The monitoring sensor 262 is configured to monitor and record the concentration of the processing liquid in the high-concentration processing liquid storage unit 170.

The control sensor 261 has multiple liquid surface sensors configured to detect respective vertical relationships between multiple measurement target heights having different heights and the liquid surface of the processing liquid. For example, the control sensor 261 has four liquid surface sensors 263, 264, 265, and 266 configured to detect respective vertical relationships between four measurement target heights H1, H2, H3, and H4 having different heights and the liquid surface of the processing liquid. The measurement target height H1 is an upper limit for the liquid surface height allowed in the high-concentration processing liquid storage unit 170. The measurement target height H2 (first height) refers to a target liquid surface height in the replenishment of the processing liquid by the processing liquid replenishing unit 210. The measurement target height H3 (second height) refers to a target liquid surface height in the concentration process of the processing liquid. The measurement target height H4 is a lower limit for the liquid surface height allowed in the high-concentration processing liquid storage unit 170.

The liquid surface sensors 263, 264, 265, and 266 are configured to detect the respective vertical relationships between the measurement target heights H1, H2, H3, and H4 and the liquid surface of the processing liquid based on, for example, a pressure for supplying the inert gas for measurement (e.g., a nitrogen gas) to the measurement target heights H1, H2, H3, and H4. For example, a threshold value between a pressure in a case where the liquid surface is higher than each of the measurement target heights H1, H2, H3, and H4 and a pressure in a case where the liquid surface is lower than each of the measurement target heights H1, H2, H3, and H4 is set. Accordingly, the liquid surface sensors 263, 264, 265, and 266 can detect the respective vertical relationships between the measurement target heights and the liquid surface based on whether or not a pressure exceeds the threshold value. The above-described configuration of the liquid surface sensors 263, 264, 265, and 266 is just an example. The liquid surface sensors 263, 264, 265, and 266 can be any of various types as long as they are capable of detecting the respective vertical relationships between the measurement target heights H1, H2, H3, and H4 and the liquid surface of the processing liquid. For example, the liquid surface sensors 263, 264, 265, and 266 may be capacitance type liquid surface sensors.

The monitoring sensor 262 is configured to obtain an estimated liquid surface height based on, for example, a pressure (hereinafter, simply referred to as "supply pressure") for supplying the inert gas (e.g., nitrogen gas) for measurement into the processing liquid from the lower portion of the high-concentration processing liquid storage unit 170. Here, the supply pressure can be changed by other factors for the liquid surface height of the processing liquid. Specific examples of the other factors may include a boiling level of the processing liquid. Therefore, the monitoring sensor 262 may further include a configuration in which the accuracy in detecting the liquid surface height can be improved by reducing the effect of the boiling level. In a case where the liquid surface height is changed slightly, it is possible to detect the boiling level based on the supply pressure of the inert gas for measurement. Thus, for a period during which the liquid surface height cannot be changed greatly, it is possible to detect the boiling level based on the supply pressure to reduce the effect of the boiling level by using the detection result. Further, since the boiling level is correlated with the concentration of the processing liquid, it is also possible to calculate the concentration of the processing liquid from the detected value of the boiling level. Furthermore, since a variation range in the supply pressure depending on a difference in the boiling level is different from a variation range in the supply pressure depending on a change in the liquid surface height, measurement gauges of the supply pressure may be provided for detecting the change in the liquid surface height and for detecting the change in the boiling level, respectively, and measurement ranges thereof may be regulated individually.

The above-described configuration of the concentration sensor 260 is just an example. The concentration sensor 260 can be any of various types as long as it is capable of detecting the information about the concentration of the processing liquid. For example, the concentration sensor 260 may not have the monitoring sensor 262. Further, the concentration sensor 260 may be configured to detect the concentration of the processing liquid regardless of the liquid surface height of the processing liquid. Specific examples of the sensor for detecting the concentration of the processing liquid regardless of the liquid surface height of the processing liquid may include an ultrasonic or optical concentration sensor.

The above-described concentration increase promoting unit 39A can be controlled by, for example, the control unit 7. By way of example, the control unit 7 further performs a third control to regulate the concentration of the processing liquid in the high-concentration processing liquid storage unit 170 to a supply concentration higher than the concentration of the processing liquid in the processing liquid storage unit 38. By way of example, the control unit 7 further includes a pre-supply concentration regulating unit 75. In the third control, the pre-supply concentration regulating unit 75 controls the processing liquid replenishing unit 210 to replenish the high-concentration processing liquid storage unit 170 with the processing liquid, the processing liquid replenishing unit 210 to supply the processing liquid from the high-concentration processing liquid storage unit 170 into the processing liquid storage unit 38, and the processing liquid supply unit 250 to stop the supply of the processing liquid from the high-concentration processing liquid storage unit 170 into the processing liquid storage unit 38 until the concentration of the processing liquid in the high-concentration processing liquid storage unit 170 reaches a supply concentration higher than the concentration of the processing liquid replenished by the processing liquid replenishing unit 210.

For example, the pre-supply concentration regulating unit 75 includes a processing liquid replenishment control unit 76, a heating control unit 79, a supply control unit 78, and a diluting liquid replenishment control unit 77. The processing liquid replenishment control unit 76 is configured to control the processing liquid replenishing unit 210 to replenish the high-concentration processing liquid storage unit 170 with the processing liquid. For example, the pre-supply concentration regulating unit 75 controls the processing liquid replenishing unit 210 to start the replenishment of the processing liquid in the state where the processing liquid is not in the high-concentration processing liquid storage unit 170 and stop the replenishment of the processing liquid when the liquid surface height of the processing liquid reaches the measurement target height H2. To be more specific, the pre-supply concentration regulating unit 75 controls the processing liquid replenishing unit 210 to open the valve 212 in the state where the processing liquid is not in the high-concentration processing liquid storage unit 170. Then, the pre-supply concentration regulating unit 75 repeatedly obtains, from the liquid surface sensor 264, information indicating whether or not the liquid surface height of the processing liquid has reached the measurement target height H2, and controls the processing liquid replenishing unit 210 to close the valve 212 when it is determined that the liquid surface height has reached the measurement target height H2.

The heating control unit 79 is configured to control the heating unit 240 to heat the processing liquid replenished into the high-concentration processing liquid storage unit 170 by the processing liquid replenishing unit 210. For example, the heating control unit 79 controls the heating unit 240 to force-feed the liquid discharged from the lower portion of the high-concentration processing liquid storage unit 170 to the heater 243 by the pump 241.

The supply control unit 78 is configured to control the processing liquid supply unit 250 to supply the processing liquid from the high-concentration processing liquid storage unit 170 into the processing liquid storage unit 38. For example, when the second control is performed to promote the increase in the concentration of the processing liquid in the processing liquid storage unit 38, the supply control unit 78 controls the processing liquid supply unit 250 to switch from the circulation state (the valve 253 is opened and the valve 251 is closed) to the supply state (the valve 253 is closed and the valve 251 is opened).

Further, the supply control unit 78 controls the processing liquid supply unit 250 to stop the supply of the processing liquid from the high-concentration processing liquid storage unit 170 into the processing liquid storage unit 38 until the concentration of the processing liquid in the high-concentration processing liquid storage unit 170 reaches a supply concentration higher than the concentration of the processing liquid replenished by the processing liquid replenishing unit 210. For example, the supply control unit 78 controls the processing liquid supply unit 250 to prohibit the switch from the circulation state to the supply state until the liquid surface height of the processing liquid in the high-concentration processing liquid storage unit 170 having reached the measurement target height H2 is decreased to the measurement target height H3.

When the concentration of the processing liquid in the high-concentration processing liquid storage unit 170 reaches the supply concentration and then further increases, the diluting liquid replenishment control unit 77 controls the diluting liquid replenishing unit 220 to replenish the high-concentration processing liquid storage unit 170 with the diluting liquid in an amount allowing the increased concentration to be close to the supply concentration. For example, when the liquid surface height of the processing liquid having reached the measurement target height H2 is decreased to the measurement target height H3 and then further decreased, the diluting liquid replenishment control unit 77 controls the diluting liquid replenishing unit 220 to replenish the high-concentration processing liquid storage unit 170 with the diluting liquid in an amount allowing the decreased liquid surface height to be close to the measurement target height H3. To be more specific, the diluting liquid replenishment control unit 77 controls the diluting liquid replenishing unit 220 to open the valve 222 until the liquid surface height of the processing liquid reaches the measurement target height H3.

Figure 11:
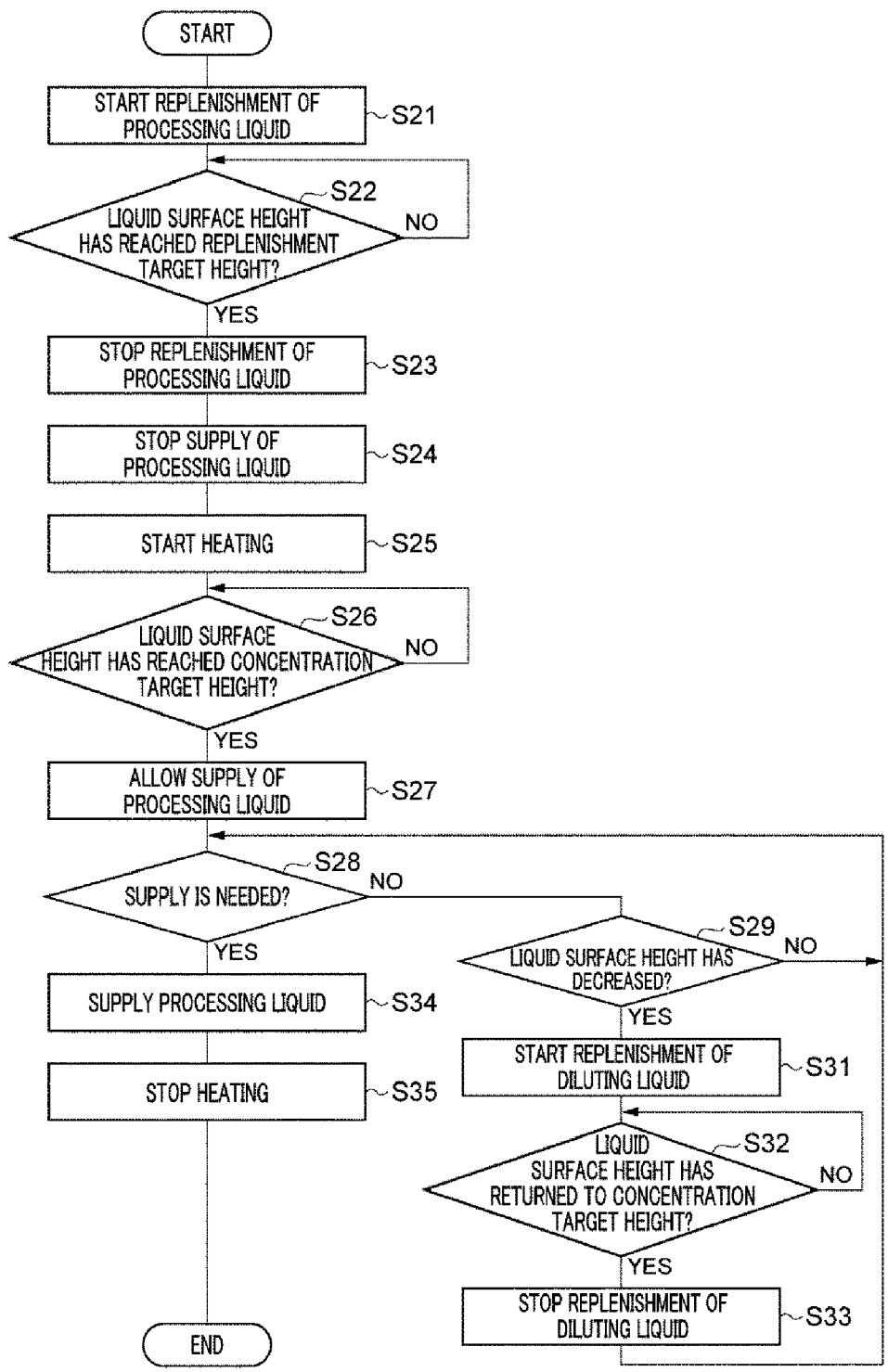
FIG. 11 is a flowchart for describing a sequence of supply of a high-concentration processing liquid.

Now, a sequence of the control performed by the control unit 7 having the pre-supply concentration regulating unit 75 will be described in more detail. As shown in FIG. 11, the control unit 7 performs processes S21, S22, and S23 first. In the process S21, the processing liquid replenishment control unit 76 controls the processing liquid replenishing unit 210 to start the replenishment of the processing liquid in the state where the processing liquid is not in the high-concentration processing liquid storage unit 170. In the process S22, the processing liquid replenishment control unit 76 controls the processing liquid replenishing unit 210 to continuously perform the replenishment of the processing liquid until the liquid surface sensor 264 detects that the liquid surface height of the processing liquid has reached the measurement target height H2. In the process S23, the processing liquid replenishment control unit 76 controls the processing liquid replenishing unit 210 to stop the replenishment of the processing liquid.

Then, the control unit 7 preforms steps S24, S25, S26, and S27. In the process S24, the supply control unit 78 stop the switchover from the circulation state to the supply state by the processing liquid supply unit 250. Then, the circulation state is maintained by the processing liquid supply unit 250 until the switchover from the circulation state to the supply state is allowed. In the process S25, the heating control unit 79 controls the heating unit 240 to start force-feeding of the processing liquid by the pump 241 and the heating of the processing liquid. In the process S26, the supply control unit 78 keeps the stop of the switchover from the circulation state to the supply state until the liquid surface sensor 265 detects that the liquid surface height of the processing liquid has decreased to the measurement target height H3. In the process S27, the supply control unit 78 allows the switchover from the circulation state to the supply state. Thereafter, it is possible to switch from the circulation state to the supply state when necessary.

Then, the control unit 7 performs a process S28. In the process S28, the supply control unit 78 checks whether or not the processing liquid needs to be supplied from the high-concentration processing liquid storage unit 170 into the processing liquid storage unit 38 (e.g., whether or not the increase in the concentration of the processing liquid in the processing liquid storage unit 38 needs to be promoted when the second control is performed).

In the process S28, if it is determined that the processing liquid does not need to be supplied from the high-concentration processing liquid storage unit 170 into the processing liquid storage unit 38, the control unit 7 performs a process S29. In the process S29, the diluting liquid replenishment control unit 77 checks whether or not a further decrease in the liquid surface height from the measurement target height H3 is detected by the liquid surface sensor 265. In the process S29, if it is determined that the further decrease in the liquid surface height from the measurement target height H3 is not detected, the control unit 7 returns the processing back to the process S28.

In the process S29, if it is determined that the further decrease in the liquid surface height from the measurement target height H3 is detected, the control unit 7 performs steps S31, S32, and S33. In the process S31, the diluting liquid replenishment control unit 77 controls the diluting liquid replenishing unit 220 to open the valve 222 and start the replenishment of the high-concentration processing liquid storage unit 170 with the diluting liquid. In the process S32, the diluting liquid replenishment control unit 77 controls the diluting liquid replenishing unit 220 to continuously perform the replenishment of the diluting liquid until a return of the liquid surface height to the measurement target height H3 is detected by the liquid surface sensor 265. In the process S33, the diluting liquid replenishment control unit 77 controls the diluting liquid replenishing unit 220 to stop the replenishment of the diluting liquid. Then, the control unit 7 returns the processing to the process S28. Then, while the replenishment of the diluting liquid is performed when necessary, whether or not the processing liquid needs to be supplied from the high-concentration processing liquid storage unit 170 into the processing liquid storage unit 38 is checked repeatedly.

In the process S28, if it is determined that the processing liquid needs to be supplied from the high-concentration processing liquid storage unit 170 into the processing liquid storage unit 38, the control unit 7 performs process S34 and S35. In the process S34, the supply control unit 78 controls the processing liquid supply unit 250 to switch from the circulation state to the supply state and supply the processing liquid from the high-concentration processing liquid storage unit 170 into the processing liquid storage unit 38. In the process S35, the heating unit 240 is controlled to stop the force-feeding of the processing liquid by the pump 241 and stop the heating of the processing liquid. Then, the sequence of the control for supplying the processing liquid from the high-concentration processing liquid storage unit 170 into the processing liquid storage unit 38 is completed. Further, the process S34 and the process S35 may not be performed in this sequence or may be performed in the reverse sequence.

The above-described configuration includes the high-concentration processing liquid storage unit 170 configured to store the processing liquid to be supplied into the processing liquid storage unit 38; the processing liquid replenishing unit 210 configured to replenish the high-concentration processing liquid storage unit 170 with the processing liquid; the heating unit 240 configured to heat the processing liquid in the high-concentration processing liquid storage unit 170; and the processing liquid supply unit 250 configured to supply the processing liquid from the high-concentration processing liquid storage unit 170 into the processing liquid storage unit 38.

According to this configuration, the concentration of the processing liquid in the high-concentration processing liquid storage unit 170 is increased prior to the supply timing of the processing liquid into the processing liquid storage unit 38, so that the high-concentration processing liquid can be rapidly supplied into the processing liquid storage unit 38 at the supply timing. Further, according to the configuration to promote the increase in the concentration of the processing liquid in the high-concentration processing liquid storage unit 170 by heating, a completely heated processing liquid can be supplied into the processing liquid storage unit 38, so that the heating time of the processing liquid in the processing liquid storage unit 38 can be reduced. Therefore, it is effective in rapidly regulating the concentration of the processing liquid in the processing liquid storage unit 38.

The concentration increase promoting unit 39A may further include the concentration sensor 260 configured to detect information about the concentration of the processing liquid in the high-concentration processing liquid storage unit 170. In this case, it is possible to regulate the concentration of the processing liquid with higher accuracy prior to the supply timing. Therefore, it is effective in more rapidly regulating the concentration of the processing liquid in the processing liquid storage unit 38.

The concentration sensor 260 may detect information about the liquid surface height of the processing liquid in the high-concentration processing liquid storage unit 170 as the information about the concentration of the processing liquid. In this case, the concentration sensor 260 can have a simpler configuration than a sensor configured to measure the concentration itself.

The concentration sensor 260 may have the multiple liquid surface sensors 263, 264, 265, and 266 configured to detect respective vertical relationships between the different measurement target heights and the liquid surface. In this case, the concentration sensor 260 can have a much simpler configuration. Further, the vertical relationships between the different measurement target heights and the liquid surface can be determined simply, so that it is hardly affected by measurement error factors such as noise or the like. For this reason, the configuration to detect the vertical relationship between the measurement target height and the liquid surface is also effective in improving the reliability of the information about the concentration.

The concentration increase promoting unit 39A may further include the diluting liquid replenishing unit 220 configured to replenish the high-concentration processing liquid storage unit 170 with the diluting liquid having the lower concentration than that of the processing liquid replenished into the processing liquid storage unit 38 by the high-concentration processing liquid storage unit 170. In this case, it is possible to easily maintain the concentration of the processing liquid to the proper level.

The heating unit 240 may be configured to heat the processing liquid discharged from the lower portion of the high-concentration processing liquid storage unit 170 to return the processing liquid to the upper portion of the high-concentration processing liquid storage unit 170. In this case, the uniformity in the temperature of the processing liquid in the high-concentration processing liquid storage unit 170 can be improved, so that the non-uniformity in the increase of the concentration can be suppressed.

The control unit 7 may be configured to control the processing liquid replenishing unit 210 to replenish the high-concentration processing liquid storage unit 170 with the processing liquid, the processing liquid supply unit 250 to supply the processing liquid from the high-concentration processing liquid storage unit 170 into the processing liquid storage unit 38, and the processing liquid supply unit 250 to stop the supply of the processing liquid from the high-concentration processing liquid storage unit 170 into the processing liquid storage unit 38 until the concentration of the processing liquid in the high-concentration processing liquid storage unit 170 reaches a higher supply concentration than the concentration of the processing liquid replenished by the processing liquid replenishing unit 210. In this case, it is possible to automatically regulate the concentration of the processing liquid prior to the supply timing.

The control unit 7 may control the processing liquid replenishing unit 210 to replenish the processing liquid until the liquid surface height of the processing liquid in the high-concentration processing liquid storage unit 170 reaches the measurement target height H2, and then, may control the processing liquid supply unit 250 to stop the supply of the processing liquid from the high-concentration processing liquid storage unit 170 into the processing liquid storage unit 38 until the liquid surface height of the processing liquid in the high-concentration processing liquid storage unit 170 is decreased to the measurement target height H3. In this case, while the concentration is regulated based on the liquid surface height, the correlation between the liquid surface height and the concentration is maintained. For this reason, it is possible to perform the simplified regulation of a concentration based on the liquid surface height with high reliability.

The control unit 7 may be configured to further control the diluting liquid replenishing unit 220 to replenish the high-concentration processing liquid storage unit 170 with the diluting liquid in an amount allowing the concentration of the processing liquid in the high-concentration processing liquid storage unit 170 to be close to the supply concentration. In this case, it is possible to automatically keep maintaining the concentration of the processing liquid.

The above-described embodiment includes the following configuration.

(Remark 1)

A substrate liquid processing apparatus, including:
a liquid processing unit in which a processing liquid and a substrate, which is a target to be immersed in the processing liquid, are received;
a supply liquid storage unit configured to store the processing liquid to be supplied into the liquid processing unit;
a processing liquid replenishing unit configured to replenish the supply liquid storage unit with the processing liquid;
a heating unit configured to heat the processing liquid in the supply liquid storage unit; and
a processing liquid supply unit configured to supply the processing liquid from the supply liquid storage unit into the liquid processing unit.

(Remark 2)

The substrate liquid processing apparatus described in Remark 1, further comprising:
a concentration sensor configured to detect information about a concentration of the processing liquid in the supply liquid storage unit.

(Remark 3)

The substrate liquid processing apparatus described in Remark 2,
wherein the concentration sensor detects information about a liquid surface height of the processing liquid in the supply liquid storage unit as the information about the concentration of the processing liquid.

(Remark 4)

The substrate liquid processing apparatus described in Remark 3,
wherein the concentration sensor includes multiple liquid surface sensors configured to detect respective vertical relationships between multiple different measurement target heights and a liquid surface.

(Remark 5)

The substrate liquid processing apparatus described in any one of Remarks 1 to 4, further comprising:
a diluting liquid replenishing unit configured to replenish the supply liquid storage unit with a diluting liquid having a lower concentration than that of the processing liquid replenished into the supply liquid storage unit by the processing liquid replenishing unit.

(Remark 6)

The substrate liquid processing apparatus described in any one of Remarks 1 to 4,
wherein the heating unit is configured to heat the processing liquid discharged from a lower portion of the supply liquid storage unit and return the processing liquid to an upper portion of the supply liquid storage unit.

(Remark 7)

The substrate liquid processing apparatus described in any one of Remarks 1 to 6, further comprising:
a control unit configured to control the processing liquid replenishing unit to replenish the supply liquid storage unit with the processing liquid; the processing liquid supply unit to supply the processing liquid from the supply liquid storage unit into the liquid processing unit; and the processing liquid supply unit to stop the supply of the processing liquid from the supply liquid storage unit into the liquid processing unit until a concentration of the processing liquid in the supply liquid storage unit reaches a supply concentration higher than a concentration of the processing liquid replenished by the processing liquid replenishing unit.

(Remark 8)

The substrate liquid processing apparatus described in Remark 4, further comprising:
a control unit configured to control the processing liquid replenishing unit to replenish the supply liquid storage unit with the processing liquid; the processing liquid supply unit to supply the processing liquid from the supply liquid storage unit into the liquid processing unit; and the processing liquid supply unit to stop the supply of the processing liquid from the supply liquid storage unit into the liquid processing unit until a concentration of the processing liquid in the supply liquid storage unit reaches a supply concentration higher than a concentration of the processing liquid replenished by the processing liquid replenishing unit, wherein the multiple different measurement target heights include a first height and a second height lower than the first height, and the control unit controls the processing liquid replenishing unit to replenish the processing liquid until the liquid surface height of the processing liquid in the supply liquid storage unit reaches the first height, and then, controls the processing liquid supply unit to stop the supply of the processing liquid from the supply liquid storage unit into the liquid processing unit until the liquid surface height of the processing liquid in the supply liquid storage unit is decreased to the second height.

(Remark 9)

The substrate liquid processing apparatus described in Remarks 5, further comprising:

a control unit configured to control the processing liquid replenishing unit to replenish the supply liquid storage unit with the processing liquid; the processing liquid supply unit to supply the processing liquid from the supply liquid storage unit into the liquid processing unit; the processing liquid supply unit to stop the supply of the processing liquid from the supply liquid storage unit into the liquid processing unit until a concentration of the processing liquid in the supply liquid storage unit reaches a supply concentration higher than a concentration of the processing liquid replenished by the processing liquid replenishing unit; and the diluting liquid replenishing unit to replenish the supply liquid storage unit with the diluting liquid in an amount allowing the concentration of the processing liquid in the supply liquid storage unit to be close to the supply concentration.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate liquid processing apparatus, comprising:
a processing liquid storage unit configured to store a processing liquid therein;
a drain unit configured to drain the processing liquid from the processing liquid storage unit; and
a control unit configured to control the drain unit,
wherein the control unit is configured to perform a first control in a constant concentration period during which a concentration of the processing liquid in the processing liquid storage unit is regulated to a set concentration and a second control, including multiple steps, in a concentration changing period during which the concentration of the processing liquid in the processing liquid storage unit is changed,
an individual set concentration is set for each of the multiple steps, and
in the second control, the control unit is configured to:
compare a set concentration for a current step after concentration change in the concentration changing period with a set concentration for a preceding step before the current step, and
control the drain unit to start draining of the processing liquid, when the set concentration for the current step is determined to be lower than the set concentration for the preceding step.

2. The substrate liquid processing apparatus of claim 1, further comprising:
a liquid surface sensor configured to detect a liquid surface height in the processing liquid storage unit,
wherein, in the second control, when the set concentration for the current step is determined to be lower than the set concentration for the preceding step and the liquid surface height detected by the liquid surface sensor is higher than a predetermined liquid surface reference value, the control unit is configured to control the drain unit to start the draining of the processing liquid.

3. The substrate liquid processing apparatus of claim 1, wherein the control unit is configured to perform the first control and the second control in a substrate processing period during which a substrate, which is a processing target, is immersed in the processing liquid in the processing liquid storage unit to be processed with the processing liquid.

4. The substrate liquid processing apparatus of claim 1, wherein the control unit is configured to perform the first control and the second control in a substrate processing period during which a substrate, which is a processing target, is immersed in the processing liquid in the processing liquid storage unit to be processed with the processing liquid.

* * * * *